(12) United States Patent
Goto et al.

(10) Patent No.: US 10,446,690 B2
(45) Date of Patent: Oct. 15, 2019

(54) METHOD OF PRODUCTION OF SEMICONDUCTOR DEVICE

(71) Applicants: TOHOKU UNIVERSITY, Sendai-shi, Miyagi (JP); ZEON CORPORATION, Tokyo (JP)

(72) Inventors: Tetsuya Goto, Sendai (JP); Makoto Takeshita, Tokyo (JP)

(73) Assignees: TOHOKU UNIVERSITY, Sendai-shi, Miyagi (JP); ZEON CORPORATION, Tokyo (JP)

(*) Notice: Subject to any disclaimer, the term of this patent is extended or adjusted under 35 U.S.C. 154(b) by 0 days.

(21) Appl. No.: 15/039,335

(22) PCT Filed: Nov. 25, 2014

(86) PCT No.: PCT/JP2014/081027
§ 371 (c)(1),
(2) Date: May 25, 2016

(87) PCT Pub. No.: WO2015/080071
PCT Pub. Date: Jun. 4, 2015

(65) Prior Publication Data
US 2017/0186874 A1    Jun. 29, 2017

(30) Foreign Application Priority Data

Nov. 28, 2013 (JP) ................. 2013-246261

(51) Int. Cl.
*H01L 29/786* (2006.01)
*C08F 2/06* (2006.01)
(Continued)

(52) U.S. Cl.
CPC ............ *H01L 29/7869* (2013.01); *C08F 2/06* (2013.01); *C08F 283/14* (2013.01); *C08G 61/02* (2013.01);
(Continued)

(58) Field of Classification Search
CPC ............ H01L 29/7869; H01L 23/3171; H01L 23/293; H01L 21/02318
See application file for complete search history.

(56) References Cited

U.S. PATENT DOCUMENTS 6,649,434 B2 * 11/2003 Iwata .................... C30B 23/02
257/E21.462
2011/0059575 A1 3/2011 Tsubuku et al.
2013/0320339 A1 * 12/2013 Kawashima ...... H01L 29/66765
257/43

FOREIGN PATENT DOCUMENTS

| JP | 2010-199390 A | 9/2010 |
| JP | 2011-77514 A | 4/2011 |
| WO | 2011/108533 A | 9/2011 |

OTHER PUBLICATIONS

International Search Report dated Feb. 24, 2015, issued in counterpart International Application No. PCT/JP2014/081027 (2 pages).
(Continued)

*Primary Examiner* — Syed I Gheyas
(74) *Attorney, Agent, or Firm* — Westerman, Hattori, Daniels & Adrian, LLP

(57) ABSTRACT

A method of production of a semiconductor device comprising a semiconductor layer forming step of forming a semiconductor layer including an inorganic oxide semiconductor on a board, a passivation film forming step of forming a passivation film comprising an organic material so as to cover the semiconductor layer, a baking step of baking the passivation film, and a cooling step of cooling the passivation film after baking, herein, in the cooling step, a cooling speed from a baking temperature at the time of baking in the baking step to a temperature 50° C. lower than the baking temperature is substantially controlled to 0.5 to 5° C./min in range is provided.

8 Claims, 8 Drawing Sheets

(51) Int. Cl.
- *H01L 21/02* (2006.01)
- *H01L 29/66* (2006.01)
- *C08F 283/14* (2006.01)
- *C08L 65/00* (2006.01)
- *C08G 61/02* (2006.01)
- *H01L 23/29* (2006.01)
- *H01L 23/31* (2006.01)
- *C08K 5/5425* (2006.01)
- *C08L 33/08* (2006.01)
- *C08F 220/10* (2006.01)

(52) U.S. Cl.
CPC .......... *C08K 5/5425* (2013.01); *C08L 33/08* (2013.01); *C08L 65/00* (2013.01); *H01L 21/02118* (2013.01); *H01L 21/02123* (2013.01); *H01L 21/02318* (2013.01); *H01L 21/02565* (2013.01); *H01L 23/293* (2013.01); *H01L 23/3171* (2013.01); *H01L 29/66969* (2013.01); *C08F 220/10* (2013.01); *C08G 2261/122* (2013.01); *C08G 2261/143* (2013.01); *C08G 2261/1426* (2013.01); *C08G 2261/3325* (2013.01); *C08G 2261/418* (2013.01); *C08G 2261/724* (2013.01); *C08G 2261/77* (2013.01); *C08G 2261/92* (2013.01); *H01L 2224/05* (2013.01)

(56) References Cited

OTHER PUBLICATIONS

International Preliminary Report on Patentability (Form PCT/IB/373) dated May 31, 2016, issued in International Patent Application No. PCT/JP2014/081027, with Form PCT/ISA/237. (3 pages).

* cited by examiner

METHOD OF PRODUCTION OF SEMICONDUCTOR DEVICE

TECHNICAL FIELD

The present invention relates to a method of production of a semiconductor device, more particularly relates to a method of production of a semiconductor device with a threshold voltage Vth close to zero and a high mobility and a semiconductor device obtained by that method of production.

BACKGROUND ART

Semiconductor devices are being widely used in electronic products. For example, a thin film transistor, as one example of a semiconductor device, is a switching device having a gate electrode, source electrode, and drain electrode. It is being widely used for active devices of active matrix boards of active matrix type liquid crystal displays or organic EL and other display devices.

In conventional thin film transistors, sputtering, vapor deposition, or CVD was used to form a passivation film (protective film) comprised of a silicon nitride film (SiNx film) on the surface of the semiconductor layer. However, in the method of forming a passivation film comprised of an inorganic material such as a silicon nitride film, there were the problems that the passivation film had to be formed in the state of plasmatising or ionizing the material in the vacuum, the equipment was large in size, and the operation was complicated. Further, if removing the passivation film comprised of an inorganic material or changing the material or method of production to a material or method enabling formation of a film by a method of a simpler process, there was the problem that the reliability became poor.

As opposed to this, for example, Patent Document 1 proposes a method of forming a passivation film of a thin film transistor by an organic material. In this Patent Document 1, as the organic material for forming the passivation film, a heat cross-linkable resin composition containing at least one type of resin selected from a cyclic olefin polymer, acrylic resin, cardo resin, polysiloxane, or polyimide and a cross-linking agent has been used. However, this Patent Document 1 is art using a semiconductor layer comprised of an amorphous silicon layer. For example, if the semiconductor layer is formed by using an indium gallium zinc oxide (IGZO) or other inorganic oxide semiconductor, there were the problems that the absolute value of the threshold voltage Vth ended up becoming larger and the mobility ended up falling.

PRIOR ART DOCUMENTS

Patent Documents

Patent Document 1: International Publication No. 2011/108533A

SUMMARY OF THE INVENTION

Technical Problem

The present invention has as its object the provision of a method for producing a semiconductor device with a threshold voltage Vth close to zero and with a high mobility and a semiconductor device obtained by such a method of production.

Solution to Problem

The inventors engaged in intensive research to achieve the above object and as a result discovered that when producing a semiconductor device using a semiconductor layer containing an inorganic oxide semiconductor, it is possible to solve this problem by forming a passivation film comprised of an organic material so as to cover the semiconductor layer, baking it, then cooling it after baking by a predetermined cooling speed and thereby completed the present invention.

That is, according to the present invention, there is provided a method of production of a semiconductor device comprising a semiconductor layer forming step of forming a semiconductor layer including an inorganic oxide semiconductor on a board, a passivation film forming step of forming a passivation film comprising an organic material so as to cover the semiconductor layer, a baking step of baking the passivation film, and a cooling step of cooling the passivation film after baking, wherein, in the cooling step, a cooling speed from a baking temperature at the time of baking in the baking step to a temperature 50° C. lower than the baking temperature is substantially controlled to 0.5 to 5° C./min in range.

In the present invention, preferably the baking temperature in the baking step is 200 to 300° C.

In the present invention, preferably, in the cooling step, a cooling speed from the baking temperature at the baking step to 150° C. is substantially controlled to 0.5 to 5° C./min in range.

In the present invention, preferably the baking in the baking step and the cooling in the cooling step is performed in a non-oxidizing atmosphere.

In the present invention, preferably the passivation film is formed using a resin composition containing at least one type of resin selected from a group consisting of a cyclic olefin resin, acrylic resin, cardo resin, polysiloxane resin, and polyimide resin.

In the present invention, preferably the passivation film is formed using a resin composition containing a cyclic olefin resin having a protonic polar group, more preferably the resin composition further contains an alkoxysilyl group containing (meth)acrylate compound, tetrafunctional or higher functional (meth)acrylate compound, photopolymerization initiator, and cross-linking agent.

Further, according to the present invention, there is provided a semiconductor device obtained by any of the above methods.

Advantages Effects

According to the present invention, it is possible to provide a semiconductor device using a semiconductor layer containing an inorganic oxide semiconductor having a threshold voltage Vth of close to zero and a high mobility. Particularly, since the semiconductor device obtained by the method of production of the present invention has a threshold voltage Vth close to zero and further is high in mobility, it is useful as a thin film transistor.

DESCRIPTION OF EMBODIMENTS

The method of production of a semiconductor device of the present invention comprises a semiconductor layer forming step of forming a semiconductor layer including an inorganic oxide semiconductor on a board, a passivation film forming step of forming a passivation film comprising an organic material so as to cover the semiconductor layer, a baking step of baking the passivation film, and a cooling step of cooling the passivation film after baking, wherein, in the cooling step, a cooling speed from a baking temperature at the time of baking in the baking step to a temperature 50° C. lower than the baking temperature is substantially controlled in range of 0.5 to 5° C./min.

Figure 1:
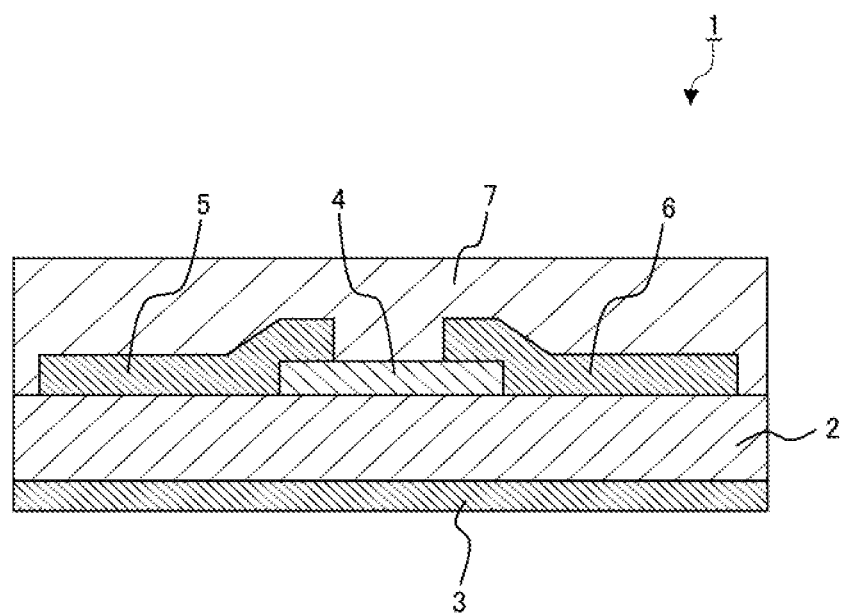
FIG. 1 is a cross sectional view of a semiconductor device 1 as one example of the semiconductor device obtained by the method of production of the present invention.

Below, referring to the drawings, the method of production of a semiconductor device of the present invention will be explained. FIG. 1 is a cross sectional view of a semiconductor device 1 as one example of the semiconductor device obtained by the method of production of the present invention. As shown in FIG. 1, the semiconductor device 1 as one example of the semiconductor device obtained by the method of production of the present invention has a gate electrode 3 on the back surface of a board 2 and has a semiconductor layer 4, source electrode 5, drain electrode 6, and passivation film 7 on the board 2.

The semiconductor device 1 shown in FIG. 1 is, for example, produced by the following method. Here, FIGS. 2A to 2C and FIGS. 3A to 3C are views showing the steps of producing the semiconductor device 1.

Figure 2A:
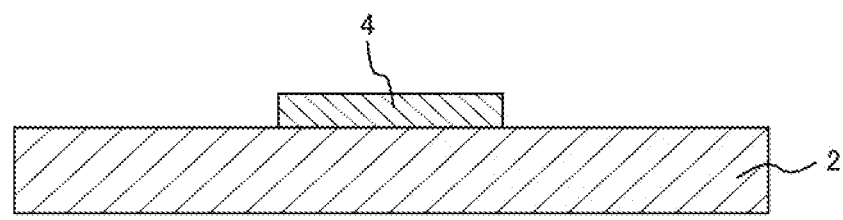
FIGS. 2A to 2C are views showing steps of production of the semiconductor device 1 (part 1).

First, as shown in FIG. 2A, a board 2 is formed with a semiconductor layer 4. The board 2 is not particularly limited. A flexible substrate comprised of a polycarbonate, polyimide, polyethylene terephthalate, alicyclic olefin polymer, or other flexible plastic, a glass substrate of quartz, soda glass, inorganic alkali glass, etc., a silicon substrate such as a silicon wafer, etc. may be mentioned. Note that, when using a silicon substrate as the board 2, it is desirable to use the substrate with a thermal oxide film on its surface by thermally oxidizing in advance. The thus formed thermal oxide film usually acts as a gate insulating film.

The semiconductor layer 4 is a layer comprised of an inorganic oxide semiconductor. The inorganic oxide semiconductor may be one containing at least one type of element among In, Ga, and Zn, but, for example, zinc oxide (ZnO), indium zinc oxide (IZO), zinc tin oxide (ZTO), aluminum zinc oxide (AZO), gallium zinc oxide (GZO), indium gallium zinc oxide (IGZO), etc. may be mentioned. The semiconductor layer 4 is formed with a layer comprised of an inorganic oxide semiconductor by sputtering on the board 2, then is patterned into predetermined patterns.

For example, when forming the semiconductor layer 4 by an indium gallium zinc oxide (IGZO), first, indium oxide ($In_2O_3$), gallium oxide ($Ga_2O_3$), and zinc oxide (ZnO) are respectively mixed and sintered in equimolar amounts to form targets. Then using the targets, the DC (direct current) sputtering method is used to form a film and form a layer comprised of an inorganic oxide semiconductor. Note that, the sputtering can be performed by introducing a flow rate 5 to 300 scan of argon (Ar) gas and a flow rate 5 to 300 scan of oxygen ($O_2$) gas into the chamber. Further, the substrate temperature at this time is made 150 to 400° C. Note that, after forming a layer comprised of an inorganic oxide semiconductor, it is possible to anneal it in a 200 to 500° C. air atmosphere for 1 to 2 hours or so. Next, a predetermined resist pattern is formed on the surface of a layer comprised of the inorganic oxide semiconductor which is formed, a layer comprised of an inorganic oxide semiconductor is etched by phosphoric acid or other acids using the resist pattern as a mask, then peel off the resist pattern to thereby form a semiconductor layer 4 on the board 2 as shown in FIG. 2A.

Next, a gate electrode 3 shown in FIG. 1 is formed on the back surface of the board 2 formed with the semiconductor layer 4, while a source electrode 5 and drain electrode 6 shown in FIG. 1 are formed on the board 2 formed with the semiconductor layer 4. The gate electrode 3, source electrode 4, and drain electrode 5 are formed by an electroconductive material. As the electroconductive material, for example, palladium, gold, silver, nickel, chromium, copper, iron, tin, antimony, lead, tantalum, indium, palladium, tellurium, rhenium, iridium, aluminum, ruthenium, germanium, molybdenum, tungsten, tin oxide antimony, indium tin oxide (ITO), fluorine doped zinc oxide, zinc, carbon, graphite, glassy carbon, silver paste and carbon paste, lithium, beryllium, magnesium, potassium, calcium, scandium, titanium, manganese, zirconium, gallium, niobium, sodium, a sodium potassium alloy, magnesium/copper mixture, magnesium/silver mixture, magnesium/aluminum mixture, magnesium/indium mixture, aluminum/aluminum oxide mixture, lithium/aluminum mixture, etc. may be mentioned. Further, a known conductive polymer improved in the electroconductivity by doping etc., for example, conductive polyaniline, conductive polypyrrole, conductive polythiophene (complex of polyethylene dioxythiophene and polystyrene sulfonic acid etc.) may be mentioned.

Figure 2B:
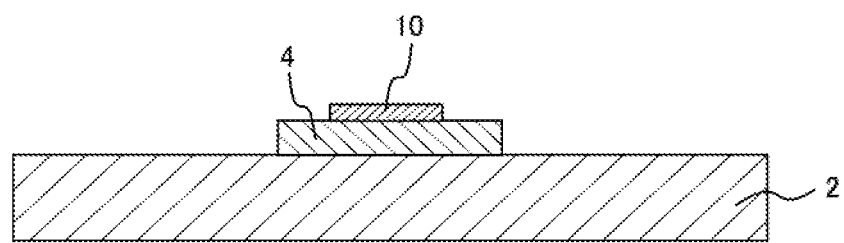
Figure 2C:
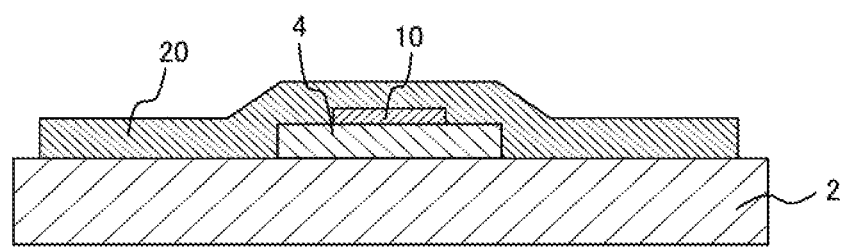

As the method of forming the gate electrode 3 shown in FIG. 1 on the back surface of the board 2 formed with the semiconductor layer 4 and forming the source electrode 5 and drain electrode 6 shown in FIG. 1 on the board 2 formed with the semiconductor layer 4, for example, the method explained next may be mentioned. That is, first, as shown in FIG. 2B, a lift off resist 10 for forming the source electrode 5 and drain electrode 6 by lift off method is formed in a predetermined pattern, then, as shown in FIG. 2C, on this, a layer 20 comprised of an electroconductive material for forming the source electrode 5 and drain electrode 6 is formed by the sputtering method over the entire surface of the top surface of the board 2 formed with semiconductor layer 4 and the lift off resist 10.

Figure 3A:
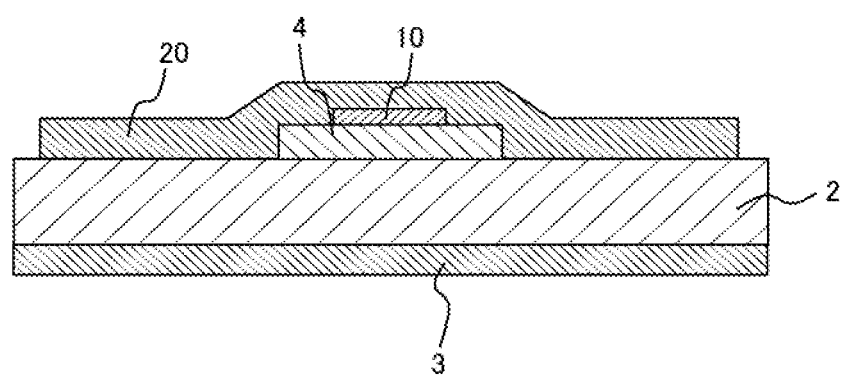
FIGS. 3A to 3C are views showing steps of production of the semiconductor device 1 (part 2).
Figure 3B:
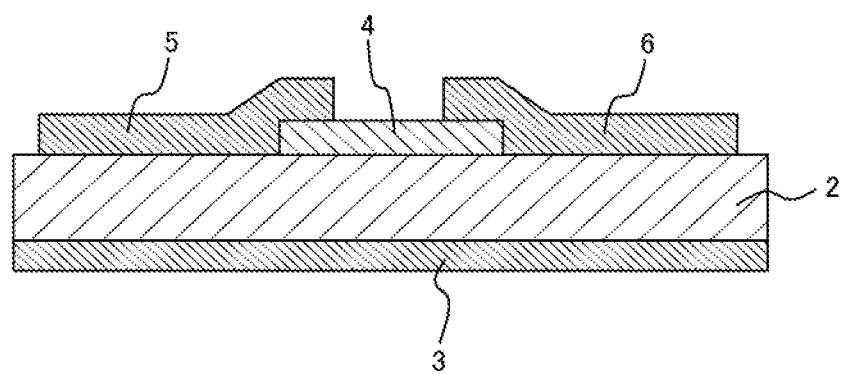

Next, separate from this, as shown in FIG. 3A, the gate electrode 3 is formed by the sputtering method over the entire surface of the back surface of the board 2. Further, after this, as shown in FIG. 3B, acetone etc. is used to remove the lift off resist 10 and the parts of the layer 20 forming the electroconductive material positioned on the lift off resist 10 to form the source electrode 5 and drain electrode 6.

Note that, in the above, the method of using the lift off method to form the source electrode 5 and drain electrode 6 was illustrated, but the invention is not particularly limited to this method. For example, it is also possible to use the method of forming a layer comprised of an electroconductive material for forming the source electrode 5 and drain electrode 6 by sputtering, then using a resist pattern as a mask to etch the layer comprised of the electroconductive material, then peeling off the resist pattern so as to form the source electrode 5 and drain electrode 6. Further, in the above, the method of forming the gate electrode 3, then forming the source electrode 5 and drain electrode 6 is illustrated, but the order of formation is not particularly limited.

Figure 3C:
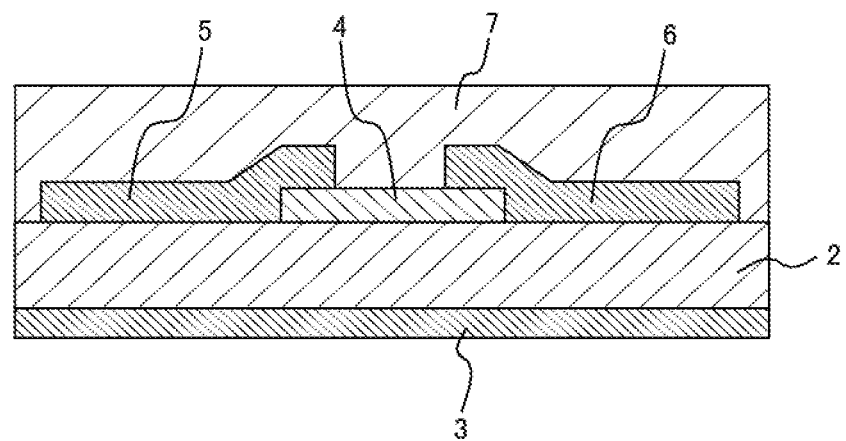

Next, as shown in FIG. 3C, a passivation film (protective layer) 7 is formed so as to cover the entire top surfaces (exposed surfaces) of the board 2, semiconductor layer 4, source electrode 5, and drain electrode 6. Specifically, a resin composition for forming the passivation film 7 is used to form a film. This is dried by heating (prebaked) in accordance with need, then baked. The baking is mainly performed for cross-linking the cross-linking agent contained in the resin composition. The conditions differ depending on the composition of the resin composition used or type of the cross-linking agent, but usually under a nitrogen atmosphere or other non-oxidizing atmosphere, a baking temperature is preferably 150 to 350° C., more preferably 200 to 300° C., and a baking time is preferably 30 to 90 minutes, more preferably 45 to 75 minutes. Note that, the resin composition used for forming the passivation film 7 will be explained later.

Next, after baking, the board 2 formed with the gate electrode 3, semiconductor layer 4, source electrode 5, drain electrode 6, and passivation film 7 is cooled. In the present embodiment, when cooling, the cooling speed from the baking temperature at the time of baking to a temperature 50° C. lower than the baking temperature at the time of baking (that is, when the baking temperature is $T_F$ (° C.), after baking at $T_F$ (° C.), the cooling speed from $T_F$(° C.) to $T_F$−50 (° C.)) is substantially controlled to 0.5 to 5° C./min. in range. In the present invention, in this way, by controlling the cooling speed when cooling after baking in the above way, the obtained semiconductor device 1 can be made one having a threshold voltage Vth close to zero and a high mobility. On the other hand, if the cooling speed in the above temperature range is too fast, in the process of cooling, defects in the semiconductor layer 4 end up increasing, a rise in the carriers due to the defects ends up occurring, and the threshold voltage Vth ends up greatly deviating from zero. Further, sometimes the problem arises that if the cooling speed at the temperature range is too slow, the productivity falls. In the present invention, the method of substantially controlling the cooling speed to 0.5 to 5° C./min in range for the cooling is not particularly limited, but for example the method of cooling the temperature in the oven used for baking by a 0.5 to 5° C./min cooling speed etc. may be mentioned. Note that, "substantially" may also be considered the case where for example the cooling speed deviates from the above range for an instant, but even such a case is included in the scope of the present invention. A time of 50% or more (preferably 90% or more) of the total cooling time should be controlled to within the range of cooling speed.

Note that, when performing cooling while substantially controlling the cooling speed to 0.5 to 5° C./min in range, the atmosphere at the time of cooling is not particularly limited, but from the viewpoint of making the obtained semiconductor device 1 one with a threshold voltage Vth closer to zero and one having a higher mobility, making it a nitrogen atmosphere or other non-oxidizing atmosphere in the same way as the time of baking is preferable.

Further, after baking, when cooling the board 2 on which the gate electrode 3, semiconductor layer 4, source electrode 5, drain electrode 6, and passivation film 7 are formed, the temperature range for controlling the cooling speed to 0.5 to 5° C./min in range should be made the baking temperature at the time of baking to a temperature 50° C. lower than the baking temperature at the time of baking. From the viewpoint of making the obtained semiconductor device 1 one with a threshold voltage Vth closer to zero and one having a higher mobility, the baking temperature at the time of baking to 150° C. is preferable. When controlling the cooling speed to 0.5 to 5° C./min in range, it is possible to perform the cooling at a certain temperature or change the temperature in 0.5 to 5° C./min of range along with the progression of cooling. For example, when changing the temperature, it is possible to lower the cooling speed in a relatively high temperature region after starting the cooling and make the cooling speed higher along with the progression of the cooling.

Note that, the cooling speed may be made 0.5 to 5° C./min range, but is preferably 0.6 to 3° C./min, more preferably 0.8 to 1.5° C./min.

Further, in the present invention, the cooling where the cooling speed is controlled to 0.5 to 5° C./min in range may be performed at least until the above predetermined temperature (temperature 50° C. lower than baking temperature, preferably 150° C.). Even after falling below the predetermined temperature, the cooling speed can be controlled to 0.5 to 5° C./min in range. Alternatively, it is possible to take out the board 2 formed with the gate electrode 3, semiconductor layer 4, source electrode 5, drain electrode 6, and passivation film 7 at a predetermined timing at ordinary temperature in an air atmosphere after falling below the predetermined temperature.

Next, the resin composition used for forming the passivation film 7 will be explained.

The resin composition used for forming the passivation film 7 is not particularly limited, but from the viewpoint of enabling the obtained semiconductor device 1 to be made one having a high reliability in a harsh atmosphere as well, it is preferably one containing at least one type of resin (A) selected from the group consisting of a cyclic olefin resin, acrylic resin, cardo resin, polysiloxane resin, and polyimide resin. From the viewpoint of a higher effect of improvement of the reliability, a cyclic olefin resin is more preferable, while a cyclic olefin resin which has a protonic polar group is particularly preferable. These resins may be respectively used alone or may be used as two types or more together.

Here, the "protonic polar group" means a group which contains an atom belonging to Group XV or Group XVI of the Periodic Table to which a hydrogen atom directly bonds. Among the atoms belonging to Group XV or Group XVI of the Periodic Table, atoms belonging to Period 1 or Period 2 of Group XV or Group XVI of the Periodic Table are preferable, an oxygen atom, nitrogen atom, or sulfur atom is more preferable, and an oxygen atom is particularly preferable.

As specific examples of such a protonic polar group, a hydroxyl group, carboxy group (hydroxycarbonyl group), sulfonic acid group, phosphoric acid group, and other polar groups which have oxygen atoms; primary amino group, secondary amino group, primary amide group, secondary amide group (imide group), and other polar groups which have nitrogen atoms; a thiol group and other polar groups which have sulfur atoms; etc. may be mentioned. Among these as well, ones which have oxygen atoms are preferable, carboxy group is more preferable. In one embodiment of the present invention, the number of protonic polar groups which bond with the cyclic olefin resin which has protonic polar groups is not particularly limited. Further, different types of protonic polar groups may also be included.

As a monomer for forming the cyclic olefin resin which has a protonic polar group, a cyclic olefin monomer which has a protonic polar group (a), cyclic olefin monomer having a polar group other than a protonic polar group (b), cyclic olefin monomer which does not have a polar group (c), and monomer other than a cyclic olefin (d) (below, simply called the monomer (a) to monomer (d)) may be mentioned. Here, monomer (d) may have a protonic polar group or a polar group other than the protonic polar group or may have no polar group. In the present invention, as the cyclic olefin resin which has a protonic polar group, one obtained by using monomer (a) and monomer (b) and/or monomer (c) is preferable, one obtained by using monomer (a) and monomer (b) is more preferable.

As specific examples of the cyclic olefin monomer which has a protonic polar group (a), 2-hydroxycarbonylbicyclo[2.2.1]hept-5-ene, 2-methyl-2-hydroxycarbonylbicyclo[2.2.1]hept-5-ene, 2-carboxymethyl-2-hydroxycarbonylbicyclo[2.2.1]hept-5-ene, 2-hydroxycarbonyl-2-methoxycarbonylmethylbicyclo[2.2.1]hept-5-ene, 2-hydroxycarbonyl-2-ethoxycarbonylmethylbicyclo[2.2.1]hept-5-ene, 2-hydroxycarbonyl-2-propoxycarbonylmethylbicyclo[2.2.1]hept-5-ene, 2-hydroxycarbonyl-2-butoxycarbonylmethylbicyclo[2.2.1]hept-5-ene, 2-hydroxycarbonyl-2-pentyloxycarbonylmethylbicyclo[2.2.1]hept-5-ene, 2-hydroxycarbonyl-2-hexyloxycarbonylmethylbicyclo[2.2.1]hept-5-ene, 2-hydroxycarbonyl-2-cyclohexyloxycarbonylmethylbicyclo[2.2.1]hept-5-ene, 2-hydroxycarbonyl-2-phenoxycarbonylmethylbicyclo[2.2.1]hept-5-ene, 2-hydroxycarbonyl-2-naphthyloxycarbonylmethylbicyclo[2.2.1]hept-5-ene, 2-hydroxycarbonyl-2-biphenyloxycarbonylmethylbicyclo[2.2.1]hept-5-ene, 2-hydroxycarbonyl-2-benzyloxycarbonylmethylbicyclo[2.2.1]hept-5-ene, 2-hydroxycarbonyl-2-hydroxyethoxycarbonylmethylbicyclo[2.2.1]hept-5-ene, 2,3-dihydroxycarbonylbicyclo[2.2.1]hept-5-ene, 2-hydroxycarbonyl-3-methoxycarbonylbicyclo[2.2.1]hept-5-ene, 2-hydroxycarbonyl-3-ethoxycarbonylbicyclo[2.2.1]hept-5-ene, 2-hydroxycarbonyl-3-propoxycarbonylbicyclo[2.2.1]hept-5-ene, 2-hydroxycarbonyl-3-butoxycarbonylbicyclo[2.2.1]hept-5-ene, 2-hydroxycarbonyl-3-pentyloxycarbonylbicyclo[2.2.1]hept-5-ene, 2-hydroxycarbonyl-3-hexyloxycarbonylbicyclo[2.2.1]hept-5-ene, 2-hydroxycarbonyl-3-cyclohexyloxycarbonylbicyclo[2.2.1]hept-5-ene, 2-hydroxycarbonyl-3-phenoxycarbonylbicyclo[2.2.1]hept-5-ene, 2-hydroxycarbonyl-3-naphthyloxycarbonylbicyclo[2.2.1]hept-5-ene, 2-hydroxycarbonyl-3-biphenyloxycarbonylbicyclo[2.2.1]hept-5-ene, 2-hydroxycarbonyl-3-benzyloxycarbonylbicyclo[2.2.1]hept-5-ene, 2-hydroxycarbonyl-3-hydroxyethoxycarbonylbicyclo[2.2.1]hept-5-ene, 2-hydroxycarbonyl-3-hydroxycarbonylmethylbicyclo[2.2.1]hept-5-ene, 3-methyl-2-hydroxycarbonylbicyclo[2.2.1]hept-5-ene, 3-hydroxymethyl-2-hydroxycarbonylbicyclo[2.2.1]hept-5-ene, 2-hydroxycarbonyltricyclo[5.2.1.0$^{2,6}$]deca-3,8-diene, 4-hydroxycarbonyltetracyclo[6.2.1.1$^{3,6}$.0$^{2,7}$]dodec-9-ene, 4-methyl-4-hydroxycarbonyltetracyclo[6.2.1.1$^{3,6}$.0$^{2,7}$]dodec-9-ene, 4,5-dihydroxycarbonyltetracyclo[6.2.1.1$^{3,6}$.0$^{2,7}$]dodec-9-ene, 4-carboxymethyl-4-hydroxycarbonyltetracyclo[6.2.1.1$^{3,6}$.0$^{2,7}$]dodec-9-ene, N-(hydroxycarbonylmethyl)bicyclo[2.2.1]hept-5-ene-2,3-dicarboxyimide, N-(hydroxycarbonylmethyl)bicyclo[2.2.1]hept-5-ene-2,3-dicarboxyimide, N-(hydroxycarbonylpentyl)bicyclo[2.2.1]hept-5-ene-2,3-dicarboxyimide, N-(dihydroxycarbonylethyl)bicyclo[2.2.1]hept-5-ene-2,3-dicarboxyimide, N-(dihydroxycarbonylpropyl)bicyclo[2.2.1]hept-5-ene-2,3-dicarboxyimide, N-(hydroxycarbonylphenethyl)bicyclo[2.2.1]hept-5-ene-2,3-dicarboxyimide, N-(2-(4-hydroxyphenyl)-1-(hydroxycarbonyl)ethyl)bicyclo[2.2.1]hept-5-ene-2,3-dicarboxyimide, N-(hydroxycarbonylphenyl)bicyclo[2.2.1]hept-5-ene-2,3-dicarboxyimide, and other carboxy group-containing cyclic olefins; 2-(4-hydroxyphenyl)bicyclo[2.2.1]hept-5-ene, 2-methyl-2-(4-hydroxyphenyl)bicyclo[2.2.1]hept-5-ene, 4-(4-hydroxyphenyl)tetracyclo[6.2.1.1$^{3,6}$.0$^{2,7}$]dodec-9-ene, 4-methyl-4-(4-hydroxyphenyl)tetracyclo[6.2.1.1$^{3,6}$.0$^{2,7}$]dodec-9-ene, 2-hydroxybicyclo[2.2.1]hept-5-ene, 2-hydroxymethylbicyclo[2.2.1]hept-5-ene, 2-hydroxyethylbicyclo[2.2.1]hept-5-ene, 2-methyl-2-hydroxymethylbicyclo[2.2.1]hept-5-ene, 2,3-dihydroxymethylbicyclo[2.2.1]hept-5-ene, 2-(hydroxyethoxycarbonyl)bicyclo[2.2.1]hept-5-ene, 2-methyl-2-(hydroxyethoxycarbonyl)bicyclo[2.2.1]hept-5-ene, 2-(1-hydroxy-1-trifluoromethyl-2,2,2-trifluoroethyl)bicyclo[2.2.1]hept-5-ene, 2-(2-hydroxy-2-trifluormethyl-3,3,3-trifluoropropyl)bicyclo[2.2.1]hept-5-ene, 3-hydroxytricyclo[5.2.1.0$^{2,6}$]deca-4,8-diene, 3-hydroxymethyltricyclo[5.2.1.0$^{2,6}$]deca-4,8-diene, 4-hydroxytetracyclo[6.2.1.1$^{3,6}$.0$^{2,7}$]dodec-9-ene, 4-hydroxymethyltetracyclo[6.2.1.1$^{3,6}$.0$^{2,7}$]dodec-9-ene, 4,5-dihydroxymethyltetracyclo[6.2.1.1$^{3,6}$.0$^{2,7}$]dodec-9-ene 4-(hydroxyethoxycarbonyl)tetracyclo[6.2.1.1$^{3,6}$.0$^{2,7}$]dodec-9-ene, 4-methyl-4-(hydroxyethoxycarbonyl)tetracyclo[6.2.1.1$^{3,6}$.0$^{2,7}$]dodec-9-ene, N-(hydroxyethyl)bicyclo[2.2.1]hept-5-ene-2,3-dicarboxyimide, N-(hydroxyphenyl)bicyclo[2.2.1]hept-5-ene-2,3-dicarboxyimide, and other hydroxyl group-containing cyclic olefins etc. nay be mentioned. Among these as well, carboxy group-containing cyclic olefins are preferable, while 4-hydroxycarbonyltetracyclo[6.2.1.1$^{3,6}$.0$^{2,7}$]dodec-9-ene is particularly preferable. These monomers (a) nay respectively be used alone or may be used as two types or more combined.

As the cyclic olefin monomer which has a polar group other than a protonic polar group (b), for example, a cyclic olefin which has an N-substituted imide group, ester group, cyano group, acid anhydride group, or halogen atom may be mentioned.

As a cyclic olefin which has an N-substituted imide group, for example, a monomer represented by the following formula (1) or a monomer represented by the following formula (2) may be mentioned.

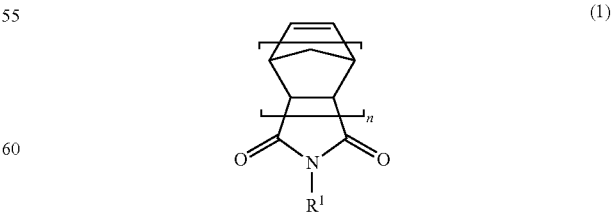

(1)

(In the above formula (1), $R^1$ indicates a hydrogen atm or $C_1$ to $C_{16}$ alkyl group or aryl group. "n" indicates an integer of 1 to 2.)

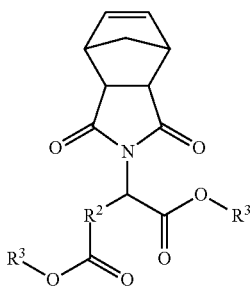

(2)

(In the above formula (2), $R^2$ indicates a $C_1$ to $C_3$ bivalent alkylene group, while $R^3$ indicates a $C_1$ to $C_{10}$ monovalent alkyl group or a $C_1$ to $C_{10}$ monovalent halogenated alkyl group.)

In the above formula (1), $R^1$ is a $C_1$ to $C_{16}$ alkyl group or aryl group. As specific examples of the alkyl group, a methyl group, ethyl group, n-propyl group, n-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, and other straight chain alkyl groups; cyclopropyl group, cyclobutyl group, cyclopentyl group, cyclohexyl group, cycloheptyl group, cyclooctyl group, cyclononyl group, cyclodecyl group, cycloundecyl group, cyclododecyl group, norbornyl group, bornyl group, isobornyl group, decahydronaphthyl group, tricyclodecanyl group, adamantyl group, and other cyclic alkyl groups; 2-propyl group, 2-butyl group, 2-methyl-1-propyl group, 2-methyl-2-propyl group, 1-methylbutyl group, 2-methylbutyl group, 1-methylpentyl group, 1-ethylbutyl group, 2-methylhexyl group, 2-ethylhexyl group, 4-methylheptyl group, 1-methylnonyl group, 1-methyltridecyl group, l-methyltetradecyl group, and other branched alkyl groups; etc. may be mentioned. Further, as specific examples of the aryl group, a benzyl group etc. may be mentioned. Among these as well, due to the more excellent heat resistance and solubility in a polar solvent, a $C_6$ to $C_{14}$ alkyl group and aryl group are preferable, while a $C_6$ to $C_{10}$ alkyl group and aryl group are more preferable. If the number of carbon atoms is 4 or less, the solubility in a polar solvent is inferior, while if the number of carbon atoms is 17 or more, the heat resistance is inferior. Further, when patterning the resin film, there is the problem that the resin film melts by heat and the patterns to end up disappearing.

As specific examples of the monomer represented by the above formula (1), bicyclo[2.2.1]hept-5-ene-2,3-dicarboxyimide, N-phenyl-bicyclo[2.2.1]hept-5-ene-2,3-dicarboxyimide, N-methylbicyclo[2.2.1]hept-5-ene-2,3-dicarboxyimide, N-ethylbicyclo[2.2.1]hept-5-ene-2,3-dicarboxyimide, N-propylbicyclo[2.2.1]hept-5-ene-2,3-dicarboxyimide, N-butylbicyclo[2.2.1]hept-5-ene-2,3-dicarboxyimide, N-cyclohexylbicyclo[2.2.1]hept-5-ene-2,3-dicarboxyimide, N-adamantylbicyclo[2.2.1]hept-5-ene-2,3-dicarboxyimide, N-(1-methylbutyl)-bicyclo[2.2.1]hept-5-ene-2,3-dicarboxyimide, N-(2-methylbutyl)-bicyclo[2.2.1]hept-5-ene-2,3-dicarboxyimide, N-(1-methylpentyl)-bicyclo[2.2.1]hept-5-ene-2,3-dicarboxyimide, N-(2-methylpentyl)-bicyclo[2.2.1]hept-5-ene-2,3-dicarboxyimide, N-(1-ethylbutyl)-bicyclo[2.2.1]hept-5-ene-2,3-dicarboxyimide, N-(2-ethylbutyl)-bicyclo[2.2.1]hept-5-ene-2,3-dicarboxyimide, N-(1-methylhexyl)-bicyclo[2.2.1]hept-5-ene-2,3-dicarboxyimide, N-(2-methylhexyl)-bicyclo[2.2.1]hept-5-ene-2,3-dicarboxyimide, N-(3-methylhexyl)-bicyclo[2.2.1]hept-5-ene-2,3-dicarboxyimide, N-(1-butylpentyl)-bicyclo[2.2.1]hept-5-ene-2,3-dicarboxyimide, N-(2-butylpentyl)-bicyclo[2.2.1]hept-5-ene-2,3-dicarboxyimide, N-(1-methylheptyl)-bicyclo[2.2.1]hept-5-ene-2,3-dicarboxyimide, N-(2-methylheptyl)-bicyclo[2.2.1]hept-5-ene-2,3-dicarboxyimide, N-(3-methylheptyl)-bicyclo[2.2.1]hept-5-ene-2,3-dicarboxyimide, N-(4-methylheptyl)-bicyclo[2.2.1]hept-5-ene-2,3-dicarboxyimide, N-(1-ethylhexyl)-bicyclo[2.2.1]hept-5-ene-2,3-dicarboxyimide, N-(2-ethylhexyl)-bicyclo[2.2.1]hept-5-ene-2,3-dicarboxyimide, N-(3-ethylhexyl)-bicyclo[2.2.1]hept-5-ene-2,3-dicarboxyimide, N-(1-propylpentyl)-bicyclo[2.2.1]hept-5-ene-2,3-dicarboxyimide, N-(2-propylpentyl)-bicyclo[2.2.1]hept-5-ene-2,3-dicarboxyimide, N-(1-methyloctyl)-bicyclo[2.2.1]hept-5-ene-2,3-dicarboxyimide, N-(2-methyloctyl)-bicyclo[2.2.1]hept-5-ene-2,3-dicarboxyimide, N-(3-methyloctyl)-bicyclo[2.2.1]hept-5-ene-2,3-dicarboxyimide, N-(4-methyloctyl)-bicyclo[2.2.1]hept-5-ene-2,3-dicarboxyimide, N-(1-ethylheptyl)-bicyclo[2.2.1]hept-5-ene-2,3-dicarboxyimide, N-(2-ethylheptyl)-bicyclo[2.2.1]hept-5-ene-2,3-dicarboxyimide, N-(3-ethylheptyl)-bicyclo[2.2.1]hept-5-ene-2,3-dicarboxyimide, N-(4-ethylheptyl)-bicyclo[2.2.1]hept-5-ene-2,3-dicarboxyimide, N-(1-propylhexyl)-bicyclo[2.2.1]hept-5-ene-2,3-dicarboxyimide, N-(2-propylhexyl)-bicyclo[2.2.1]hept-5-ene-2,3-dicarboxyimide, N-(3-propylhexyl)-bicyclo[2.2.1]hept-5-ene-2,3-dicarboxyimide, N-(1-methylnonyl)-bicyclo[2.2.1]hept-5-ene-2,3-dicarboxyimide, N-(2-methylnonyl)-bicyclo[2.2.1]hept-5-ene-2,3-dicarboxyimide, N-(3-methylnonyl)-bicyclo[2.2.1]hept-5-ene-2,3-dicarboxyimide, N-(4-methylnonyl)-bicyclo[2.2.1]hept-5-ene-2,3-dicarboxyimide, N-(5-methylnonyl)-bicyclo[2.2.1]hept-5-ene-2,3-dicarboxyimide, N-(1-ethyloctyl)-bicyclo[2.2.1]hept-5-ene-2,3-dicarboxyimide, N-(2-ethyloctyl)-bicyclo[2.2.1]hept-5-ene-2,3-dicarboxyimide, N-(3-ethyloctyl)-bicyclo[2.2.1]hept-5-ene-2,3-dicarboxyimide, N-(4-ethyloctyl)-bicyclo[2.2.1]hept-5-ene-2,3-dicarboxyimide, N-(1-methyldecyl)-bicyclo[2.2.1]hept-5-ene-2,3-dicarboxyimide, N-(1-methyldodecyl)-bicyclo[2.2.1]hept-5-ene-2,3-dicarboxyimide, N-(1-methylundecyl)-bicyclo[2.2.1]hept-5-ene-2,3-dicarboxyimide, N-(1-methyldodecyl)-bicyclo[2.2.1]hept-5-ene-2,3-dicarboxyimide, N-(1-methyltridecyl)-bicyclo[2.2.1]hept-5-ene-2,3-dicarboxyimide, N-(1-methyltetradecyl)-bicyclo[2.2.1]hept-5-ene-2,3-dicarboxyimide, N-(1-methylpentadecyl)-bicyclo[2.2.1]hept-5-ene-2,3-dicarboxyimide, N-phenyl-tetracyclo[6.2.1.1$^{3,6}$.0$^{2,7}$]dodec-9-ene-4,5-dicarboxyimide, N-(2,4-dimethoxyphenyl)-tetracyclo[6.2.1.1$^{3,6}$.0$^{2,7}$]dodec-9-ene-4,5-dicarboxyimide, etc. may be mentioned. Note that, these may respectively be used alone or may be used as two types or more combined.

On the other hand, in the above formula (2), $R^2$ is a $C_1$ to $C_3$ bivalent alkylene group. As the $C_1$ to $C_3$ bivalent alkylene group, a methylene group, ethylene group, propylene group, and isopropylene group may be mentioned. Among these as well, due to the excellent polymerization activity, a methylene group and ethylene group are preferable.

Further, in the above formula (2), $R^3$ is a $C_1$ to $C_{10}$ monovalent alkyl group or $C_1$ to $C_{10}$ monovalent halogenated alkyl group. As the $C_1$ to $C_{10}$ monovalent alkyl group, for example, a methyl group, ethyl group, propyl group, isopropyl group, butyl group, sec-butyl group, tert-butyl group, hexyl group, cyclohexyl group, etc. may be mentioned. As the $C_1$ to $C_{10}$ monovalent halogenated alkyl group, for example, a fluoromethyl group, chloromethyl group, bromomethyl group, difluoromethyl group, dichloromethyl group, difluoromethyl group, trifluormethyl group, trichloromethyl group, 2,2,2-trifluoroethyl group, pentafluoroethyl group, heptafluoropropyl group, perfluorobutyl group, perfluoropentyl group, etc. may be mentioned. Among these as well, since the solubility in a polar solvent is excellent, as $R^3$, a methyl group or ethyl group is preferable.

Note that, the monomer represented by the above formulas (1) and (2) can, for example, be obtained by an imidization reaction between a corresponding amine and 5-norbornene-2,3-dicarboxylic acid anhydride. Further, the obtained monomer can be efficiently isolated by separating and refining the reaction solution of the imidization reaction by a known method.

As the cyclic olefin which has an ester group, for example, 2-acetoxybicyclo[2.2.1]hept-5-ene, 2-acetoxymethylbicyclo[2.2.1]hept-5-ene, 2-methoxycarbonylbicyclo[2.2.1]hept-5-ene, 2-ethoxycarbonylbicyclo[2.2.1]hept-5-ene, 2-propoxycarbonylbicyclo[2.2.1]hept-5-ene, 2-butoxycarbonylbicyclo[2.2.1]hept-5-ene, 2-cyclohexyloxycarbonylbicyclo[2.2.1]hept-5-ene, 2-methyl-2-methoxycarbonylbicyclo[2.2.1]hept-5-ene, 2-methyl-2-ethoxycarbonylbicyclo[2.2.1]hept-5-ene, 2-methyl-2-propoxycarbonylbicyclo[2.2.1]hept-5-ene, 2-methyl-2-butoxycarbonylbicyclo[2.2.1]hept-5-ene, 2-methyl-2-cyclohexyloxycarbonylbicyclo[2.2.1]hept-5-ene, 2-(2,2,2-trifluoroethoxycarbonyl)bicyclo[2.2.1]hept-5-ene, 2-methyl-2-(2,2,2-trifluoroethoxycarbonyl)bicyclo[2.2.1]hept-5-ene, 2-methoxycarbonyltricyclo[5.2.1.0$^{2,6}$]dec-8-ene, 2-ethoxycarbonyltricyclo[5.2.1.0$^{2,8}$]dec-8-ene, 2-propoxycarbonyltricyclo[5.2.1.0$^{2,6}$]dec-8-ene, 4-acetoxytetracyclo[6.2.1.1$^{3,6}$.0$^{2,7}$]dodec-9-ene, 4-methoxycarbonyltetracyclo[6.2.1.1$^{3,6}$.0$^{2,7}$]dodec-9-ene, 4-ethoxycarbonyltetracyclo[6.2.1.1$^{3,6}$.0$^{2,7}$]dodec-9-ene, 4-propoxycarbonyltetracyclo[6.2.1.1$^{3,6}$.0$^{2,7}$]dodec-9-ene, 4-butoxycarbonyltetracyclo[6.2.1.1$^{3,6}$.0$^{2,7}$]dodec-9-ene, 4-methyl-4-methoxycarbonyltetracyclo[6.2.1.1$^{3,6}$.0$^{2,7}$]dodec-9-ene, 4-methyl-4-ethoxycarbonyltetracyclo[6.2.1.1$^{3,6}$.0$^{2,7}$]dodec-9-ene, 4-methyl-4-propoxycarbonyltetracyclo[6.2.1.1$^{3,6}$.0$^{2,7}$]dodec-9-ene, 4-methyl-4-butoxycarbonyltetracyclo[6.2.1.1$^{3,6}$.0$^{2,7}$]dodec-9-ene, 4-(2,2,2-trifluoroethoxycarbonyl)tetracyclo[6.2.1.1$^{3,6}$.0$^{2,7}$]dodec-9-ene, 4-methyl-4-(2,2,2-trifluoroethoxycarbonyl)tetracyclo[6.2.1.1$^{3,6}$.0$^{2,7}$]dodec-9-ene, etc. may be mentioned.

As the cyclic olefin which has a cyano group, for example, 4-cyanotetracyclo[6.2.1.1$^{3,6}$.0$^{2,7}$]dodec-9-ene, 4-methyl-4-cyanotetracyclo[6.2.1.1$^{3,6}$.0$^{2,7}$]dodec-9-ene, 4,5-dicyanotetracyclo[6.2.1.1$^{3,6}$.0$^{2,7}$]dodec-9-ene, 2-cyanobicyclo[2.2.1]hept-5-ene, 2-methyl-2-cyanobicyclo[2.2.1]hept-5-ene, 2,3-dicyanobicyclo[2.2.1]hept-5-ene, etc. may be mentioned.

As the cyclic olefin which has an acid anhydride group, for example, tetracyclo[6.2.1.1$^{3,6}$.0$^{2,7}$]dodec-9-ene-4,5-dicarboxylic anhydride, bicyclo[2.2.1]hept-5-ene-2,3-dicarboxylic anhydride, 2-carboxymethyl-2-hydroxycarbonylbicyclo[2.2.1]hept-5-ene anhydride, etc. may be mentioned.

As the cyclic olefin which has a halogen atom, for example, 2-chlorobicyclo[2.2.1]hept-5-ene, 2-chloromethylbicyclo[2.2.1]hept-5-ene, 2-(chlorophenyl)bicyclo[2.2.1]hept-5-ene, 4-chlorotetracyclo[6.2.1.1$^{3,6}$.0$^{2,7}$]dodec-9-ene, 4-methyl-4-chlorotetracyclo[6.2.1.1$^{3,6}$.0$^{2,7}$]dodec-9-ene, etc. may be mentioned.

These monomers (b) may respectively be used alone or may be used as two types or more combined.

As the cyclic olefin monomer which does not have a polar group (c), bicyclo[2.2.1]hept-2-ene (also called "norbornene"), 5-ethylbicyclo[2.2.1]hept-2-ene, 5-butyl-bicyclo[2.2.1]hept-2-ene, 5-ethylidene-bicyclo[2.2.1]hept-2-ene, 5-methylidene-bicyclo[2.2.1]hept-2-ene, 5-vinyl-bicyclo[2.2.1]hept-2-ene, tricyclo[5.2.1.0$^{2,6}$]deca-3,8-diene (common name: dicyclopentadiene), tetracyclo[10.2.1.0$^{2,11}$.0$^{4,9}$]pentadec-4,6,8,13-tetraene, tetracyclo[6.2.1.1$^{3,6}$.0$^{2,7}$]dodec-4-ene (also called "tetracyclododecene"), 9-methyl-tetracyclo[6.2.1.1$^{3,6}$.0$^{2,7}$]dodec-4-ene, 9-ethyl-tetracyclo[6.2.1.1$^{3,6}$.0$^{2,7}$]dodec-4-ene, 9-methylidene-tetracyclo[6.2.1.1$^{3,6}$.0$^{2,7}$]dodec-4-ene, 9-ethylidene-tetracyclo[6.2.1.1$^{3,6}$.0$^{2,7}$]dodec-4-ene, 9-vinyl-tetracyclo[6.2.1.1$^{3,6}$.0$^{2,7}$]dodec-4-ene, 9-propenyl-tetracyclo[6.2.1.1$^{3,6}$.0$^{2,7}$]dodec-4-ene, pentacyclo[9.2.1.1$^{3,9}$.0$^{2,10}$.0$^{4,8}$]pentadeca-5,12-diene, cyclobutene, cyclopentene, cyclopentadiene, cyclohexene, cycloheptene, cyclooctene, cyclooctadiene, indene, 3a,5,6,7a-tetrahydro-4,7-methano-1H-indene, 9-phenyl-tetracyclo[6.2.1.1$^{2,10}$.0$^{3,8}$]dodec-4-ene, tetracyclo[9.2.1.0$^{2,10}$.0$^{3,8}$]tetradec-3,5,7,12-tetraene, pentacyclo[9.2.1.1$^{3,9}$.0$^{2,10}$.0$^{4,8}$]pentadec-12-ene, etc. may be mentioned. These monomers (c) may respectively be used alone or may be used as two types or more combined.

As specific examples of the monomer other than a cyclic olefin (d), ethylene; propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene, 1-eicosene, and other $C_2$ to $C_{20}$ α-olefins; 1,4-hexadiene, 1,5-hexadiene, 4-methyl-1,4-hexadiene, 5-methyl-1,4-hexadiene, 1,7-octadiene, and other nonconjugated dienes and their derivatives; etc. may be mentioned. Among these as well, α-olefin is preferable. These monomers (d) may respectively be used alone or may be used as two types or more combined.

Further, the cyclic olefin resin which has a protonic polar group used in the present invention also can be obtained by introducing a protonic group in a cyclic olefin resin which does not have a protonic polar group utilizing a known modifying agent and performing a hydrogenation reaction accordance with need. The hydrogenation reaction can be performed for a polymer before introducing a protonic group. Further, one obtained by further introducing a protonic group by modifying a cyclic olefin resin which has a protonic polar group may be used. The polymer which does not have a protonic polar group can be obtained by polymerizing the above-mentioned monomers (b) to (d) in any combination.

Note that, the cyclic olefin resin which has a protonic polar group used in the present invention may be a ring-opened polymer obtained by ring-opening polymerization of the above-mentioned monomers or may be an addition polymer obtained by addition polymerization of the above-mentioned monomers, but from the viewpoint of the effect of one embodiment of the present invention becoming more remarkable, a ring-opened polymer is preferable.

A ring-opened polymer can be produced by ring-opening methathesis polymerization of a cyclic olefin monomer which has a protonic polar group (a) and copolymerizable monomers (b) to (d) used according to need in the presence of a methathesis reaction catalyst. As the method of production, for example, the method described in International Publication No. 2010/110323A, [0039] to [0079], etc. can be used. On the other hand, an addition polymer can be obtained by causing polymerization of a cyclic olefin monomer which has a protonic polar group (a) and copolymerizable monomers (b) to (d) used according to need using a known additional polymerization catalyst, for example, a catalyst comprised of a compound of titanium, zirconium, or vanadium and an organic aluminum compound.

Further, when the cyclic olefin resin which has a protonic polar group used in the present invention is a ring-opened polymer, it is preferable to further perform a hydrogenation reaction and obtain a hydrogenated product in which the carbon-carbon double bonds which are contained in the main chain are hydrogenated.

Further, the acrylic resin used in the present invention is not particularly limited, but a homopolymer or copolymer having at least one of a carboxylic acid which has an acryl group, carboxylic anhydride which has an acryl group, epoxy group-containing acrylate compound and oxetane group-containing acrylate compound as an essential ingredient is preferable.

As specific examples of the carboxylic acid which has an acryl group, (meth)acrylic acid (meaning acrylic acid and/or methacrylic acid, below, same for methyl(meth)acrylate etc.), crotonic acid, maleic acid, fumaric acid, citraconic acid, mesaconic acid, glutaconic acid, phthalic acid mono-(2-((meth)acryloyloxy)ethyl), N-(carboxyphenyl) maleimide, N-(carboxyphenyl)(meth)acrylamide, etc. may be mentioned. As specific examples of the carboxylic anhydride which has an acryl group, maleic anhydride, citraconic anhydride, etc. may be mentioned.

As specific examples of the epoxy group-containing acrylate compound, glycidyl acrylate, glycidyl methacrylate, glycidyl α-ethyl acrylate, glycidyl α-n-propyl acrylate, glycidyl α-n-butyl acrylate, 3,4-epoxybutyl acrylate, 3,4-epoxybutyl methacrylate, 6,7-epoxyheptyl acrylate, 6,7-epoxyheptyl methacrylate, 6,7-epoxyheptyl α-ethyacrylate, 3,4-epoxycyclohexylmethyl acrylate, 3,4-epoxycyclohexylmethyl methacrylate, etc. may be mentioned.

As specific examples of the oxetane group-containing acrylate compound, (3-methyloxetan-3-yl)methyl (meth)acrylate, (3-ethyloxetan-3-yl)methyl (meth)acrylate, (3-methyloxetan-3-yl)ethyl (meth)acrylate, (3-ethyloxetan-3-yl)ethyl (meth)acrylate, (3-chloromethyloxetan-3-yl) methyl (meth)acrylate, (oxetan-2-yl)methyl (meth)acrylate, (2-methyloxetan-2-yl)methyl (meth)acrylate, (2-ethyloxetan-2-yl)methyl (meth)acrylate, (1-methyl-1-oxetanyl-2-phenyl)-3-(meth)acrylate, (1-methyl-1-oxetanyl)-2-trifluoromethyl-3-(meth)acrylate, and (1-methyl-1-oxetanyl)-4-trifluoromethyl-2-(meth)acrylate, etc. may be mentioned. Among these as well, (meth)acrylic acid, maleic anhydride, glycidyl (meth)acrylate, 6,7-epoxyheptyl methacrylate, etc. are preferable.

The acrylic resin may also be a copolymer of at least one compound which is selected from unsaturated carboxylic acids, unsaturated carboxylic anhydrides, and epoxy group-containing unsaturated compounds, and other acrylate-based monomers or copolymerizable monomers other than acrylates.

As other acrylate-based monomers, methyl(meth)acrylate, ethyl (meth)acrylate, propyl(meth)acrylate, isopropyl (meth)acrylate, butyl (meth)acrylate, isobutyl (meth)acrylate, t-butyl (meth)acrylate, amyl (meth)acrylate, isoamyl (meth)acrylate, hexyl (meth)acrylate, heptyl (meth)acrylate, octyl (meth)acrylate, isooctyl (meth)acrylate, ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, and other alkyl (meth)acrylates; hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, 4-hydroxybutyl (meth)acrylate, and other hydroxyalkyl (meth)acrylates; phenoxyethyl (meth)acrylate, 2-hydroxy-3-phenoxypropyl (meth)acrylate, and other phenoxyalkyl (meth)acrylates; 2-methoxyethyl (meth)acrylate, 2-ethoxyethyl (meth)acrylate, 2-propoxyethyl (meth)acrylate, 2-butoxyethyl (meth)acrylate, 2-methoxybutyl (meth)acrylate, and other alkoxyalkyl (meth)acrylates; polyethylene glycol mono(meth)acrylate, ethoxydiethylene glycol (meth)acrylate, methoxypolyethylene glycol (meth)acrylate, phenoxypolyethylene glycol (meth)acrylate, nonyl phenoxypolyethylene glycol (meth)acrylate, polypropylene glycol mono (meth)acrylate, methoxypolypropylene glycol (meth)acrylate, ethoxypolypropylene glycol (meth)acrylate, nonylphenoxypolypropylene glycol (meth)acrylate, and other polyalkylene glycol (meth)acrylates; cyclohexyl (meth)acrylate, 2-methylcyclohexyl (meth)acrylate, 4-butylcyclohexyl (meth)acrylate, 1-adamantyl (meth)acrylate, 2-methyl-2-adamantyl (meth)acrylate, 2-ethyl-2-adamantyl (meth)acrylate, tricyclo[5.2.1.0$^{2,6}$]decan-8-yl (meth)acrylate, tricyclo[5.2.1.0$^{2,6}$]-3-decen-8-yl (meth)acrylate, tricyclo[5.2.1.0$^{2,6}$]-3-decen-9-yl (meth)acrylate, bornyl (meth)acrylate, isobornyl (meth)acrylate, and other cycloalkyl (meth)acrylates; phenyl (meth)acrylate, naphthyl (meth)acrylate, biphenyl (meth)acrylate, benzyl (meth)acrylate, tetrahydrofurfuryl (meth)acrylate, 5-tetrahydrofurfuryl oxycarbonylpentyl (meth)acrylate, vinyl (meth)acrylate, allyl (meth)acrylate, 2-(2-vinyloxyethoxy)ethyl (meth)acrylate, 2-[tricyclo[5.2.1.0$^{2,6}$]decan-8-yloxy]ethyl (meth)acrylate, 2-[tricyclo[5.2.1.0$^{2,6}$]-3-decen-8-yloxy]ethyl (meth)acrylate, 2-[tricyclo[5.2.1.0$^{2,6}$]-3-decen-9-yloxy]ethyl (meth)acrylate, γ-butyrolactone (meth)acrylate, maleimide, N-methylmaleimide, N-ethylmaleimide, N-butylmaleimide, N-cyclohexylmaleimide, N-benzylmaleimide, N-phenylmaleimide, N-(2,6-diethylphenyl)maleimide, N-(4-acetylphenyl) maleimide, N-(4-hydroxyphenyl) maleimide, N-(4-acetoxyphenyl) maleimide, N-(4-dimethylamino-3,5-dinitrophenyl) maleimide, N-(1-anilinonaphthyl-4) maleimide, N-[4-(2-benzooxazolyl)phenyl]maleimide, N-(9-acridinyl)maleimide, etc. may be mentioned. Among these as well, methyl (meth)acrylate, butyl (meth)acrylate, cyclohexyl (meth)acrylate, 2-methylcyclohexyl (meth)acrylate, benzyl (meth)acrylate, tricyclo[5.2.1.0$^{2,6}$]decan-8-yl (meth)acrylate, N-phenylmaleimide, N-cyclohexylmaleimide, etc. are preferable.

The copolymerizable monomer other than acrylate is not particularly limited so long as a compound which can copolymerize with the above carboxylic acid which has an acryl group, carboxylic anhydride which has an acryl group, epoxy group-containing acrylate compound, but, for example, vinylbenzylmethyl ether, vinylglycidyl ether, styrene, α-ethylstyrene, vinyltoluene, indene, vinylnaphthalene, vinylbiphenyl, chlorostyrene, bromostyrene, chloromethylstyrene, p-tert-butoxystyrene, p-hydroxystyrene, p-hydroxy-α-methylstyrene, p-acetoxystyrene, p-carboxystyrene, 4-hydroxyphenylvinylketone, acrylonitrile, methacrylonitrile, (meth)acrylamide, 1,2-epoxy-4-vinylcyclohexane, isobutene, norbornene, butadiene, isoprene, and other radical polymerizable compounds may be mentioned. These compounds may respectively be used alone or may be used as two types or more combined. The polymerization method of the above monomer may be an ordinary method. For example, the suspension polymerization method, the emulsion polymerization method, the solution polymerization method, etc. may be employed.

The Cardo resin used in one embodiment of the present invention is a resin which has a Cardo structure, that is, a skeletal structure with two cyclic structures bonded to a quaternary carbon atom which forms a cyclic structure. A general form of a Cardo structure is a structure in which benzene rings bond to a fluorene ring.

As specific examples of a skeletal structure where two cyclic structures are bonded to a quaternary carbon atom forming a cyclic structure, a fluorene skeleton, bisphenol fluorene skeleton, bisaminophenyl fluorene skeleton, fluorine skeleton having an epoxy group, fluorene skeleton having an acryl group, etc. may be mentioned.

The Cardo resin used in the present invention is formed by polymerization by reacting functional groups which bond to skeletons having Cardo structure each other. The Cardo resin has a structure where the main chain and bulky side chains are connected by a single element (Cardo structure) and has a cyclic structure in the direction substantially vertical to the main chain.

As one example of the Cardo structure, an example of a Cardo structure having an epoxyglycidyl ether structure is shown in the following formula (3).

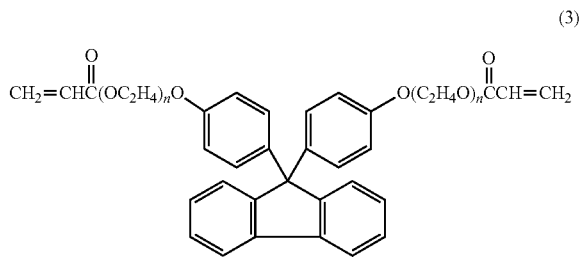

(3)

(In the above formula (3), "n" is an integer of 0 to 10.)

The monomer which has a Cardo structure is, for example, a bis(glycidyloxyphenyl) fluorene-type epoxy resin; a condensate of a bisphenolfluorene-type epoxy resin and acrylic acid; 9,9-bis(4-hydroxyphenyl)fluorene, 9,9-bis (4-hydroxy-3-methylphenyl) fluorene, or other Cardo structure-containing bisphenols; 9,9-bis(cyanomethyl) fluorene or other 9,9-bis(cyanoalkyl) fluorenes; 9,9-bis(3-aminopropyl) fluorene or other 9,9-bis(aminoalkyl) fluorenes; etc. may be mentioned.

The Cardo resin is a polymer which is obtained by polymerization of a monomer which has a Cardo structure, but may also be a copolymer with another copolymerizable monomer.

The polymerization method of the above monomers may be an ordinary method. For example, the ring-opening polymerization method or addition polymerization method etc. may be employed.

The polysiloxane resin used in the present invention is not particularly limited, but preferably a polymer which is obtained by mixing and reacting one or more types of organosilane represented by the following formula (4) may be mentioned.

(4)

In the above formula (4), $R^4$ is a hydrogen atom, $C_1$ to $C_{10}$ alkyl group, $C_2$ to $C_{10}$ alkenyl group, or $C_6$ to $C_{15}$ aryl group. The plurality of $R^4$ may be the same or different. Note that, these alkyl groups, alkenyl groups, and aryl groups may all have substituents. Further, they may be nonsubstituted groups which do not have substituents and may be selected in accordance with the properties of the composition. As specific examples of the alkyl group, a methyl group, ethyl group, n-propyl group, isopropyl group, n-butyl group, t-butyl group, n-hexyl group, n-decyl group, trifluoromethyl group, 2,2,2-trifluoroethyl group, 3,3,3-trifluoropropyl group, 3-glycidoxypropyl group, 2-(3,4-epoxy cyclohexyl) ethyl group, 3-aminopropyl group, 3-mercaptopropyl group, and 3-isocyanatepropyl group may be mentioned. As specific examples of the alkenyl group, a vinyl group, 3-acryloxypropyl group, and 3-methacryloxypropyl group may be mentioned. As specific example of the aryl group, a phenyl group, tolyl group, p-hydroxyphenyl group, 1-(p-hydroxyphenyl)ethyl group, 2-(p-hydroxyphenyl)ethyl group, 4-hydroxy-5-(p-hydroxyphenylcarbonyloxy)pentyl group, and naphthyl group may be mentioned.

Further, in the above formula (4), $R^5$ is a hydrogen atom, $C_1$ to $C_6$ alkyl group, $C_1$ to $C_6$ acyl group, or $C_6$ to $C_{15}$ aryl group, where the plurality of $R^5$ may be the same or different. Note that, these alkyl groups and acyl groups may all have substituents. Further, they may be nonsubstituted groups which do not have substituents and may be selected in accordance with the properties of the composition. As specific examples of the alkyl group, a methyl group, ethyl group, n-propyl group, isopropyl group, and n-butyl group may be mentioned. As a specific example of the acyl group, an acetyl group may be mentioned. As a specific example of an aryl group, a phenyl group may be mentioned.

Furthermore, in the above formula (4), "m" is an integer of 0 to 3. When m=0, the compound becomes tetrafunctional silane, when m=1, it becomes trifunctional silane, when m=2, it becomes bifunctional silane, and when m=3, it becomes monofunctional silane.

As specific examples of an organosilane represented by the above formula (4), tetraethoxysilane, tetraethoxysilane, tetraacetoxysilane, tetraphenoxysilane, or other tetrafunctional silanes; methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, phenyltrimethoxysilane, phenyltriethoxysilane, p-hydroxyphenyltrimethoxysilane, 1-(p-hydroxyphenyl)ethyltrimethoxysilane, 2-(p-hydroxyphenyl) ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 2-(3,4-epoxy cyclohexyl) ethyltrimethoxysilane, 3-mercaptopropyltrimethoxysilane, or other trifunctional silanes; dimethyldimethoxysilane, dimethyldiethoxysilane, dimethyldiacetoxysilane, di-n-butyldimethoxysilane, diphenyldimethoxysilane, or other bifunctional silanes; trimethylmethoxysilane, tri-n-butylethoxysilane, or other monofunctional silanes; may be mentioned.

The polysiloxane resin used in the present invention is obtained by the hydrolysis or partial condensation of the above-mentioned organosilanes. For the hydrolysis and partial condensation, general methods can be used. For example, a solvent, water, and according to need a catalyst are added to the mixture and heated and stirred. During stirring, in accordance with need, distillation may be used to distill off the hydrolysis byproducts (methanol or other alcohol) or condensation byproduct (water).

The polyimide resin used in the present invention can be obtained by heat treating a polyimide precursor obtained by reacting a tetracarboxylic anhydride and diamine. As the precursor for obtaining the polyimide resin, a polyamic acid, polyamic acid ester, polyisoimide, polyamic acid sulfonamide, etc. may be mentioned.

The polyimide resin used in the present invention is synthesized by a known method. That is, it is synthesized by a known method such as selectively combining tetracarboxylic dianhydride and a diamine and reacting these in N-methyl-2-pyrrolidone, N,N-dimethylacetoamide, N,N-dimethylformamide, dimethylsulfoxide, hexamethylphosphoric triamide, α-butyrolactone, cyclopentanone, or other polar solvent.

When excessively using a diamine for polymerization, it is possible to make a carboxylic anhydride react with the end amino group of the produced polyimide resin so as to protect the end amino group. Further, when excessively using tetracarboxylic anhydride for polymerization, it is possible to make an amine compound react with the end acid anhydride group of the produced polyimide resin so as to protect the end acid anhydride group.

As examples of such carboxylic anhydrides, phthalic anhydride, trimellitic anhydride, maleic anhydride, naphthalic anhydride, hydrogenated phthalic anhydride, methyl-5-norbornene-2,3-dicarboxylic anhydride, itaconic anhydride, tetrahydrophthalic acid anhydride, etc. may be mentioned, while as examples of amine compounds, aniline, 2-hydroxyaniline, 3-hydroxyaniline, 4-hydroxyaniline, 2-ethynylaniline, 3-ethynylaniline, 4-ethynylaniline, etc. may be mentioned.

The resin (A) used in the present invention has a weight average molecular weight (Mw) of usually 1,000 to 1,000,000, preferably 1,500 to 100,000, more preferably 2,000 to 10,000 in range. Further, the resin (A) has a molecular weight distribution of a weight average molecular weight/number average molecular weight (Mw/Mn) ratio of usually 4 or less, preferably 3 or less, more preferably 2.5 or less. The weight average molecular weight (Mw) and molecular weight distribution (Mw/Mn) of the resin (A) can be measured by gel permeation chromatography (GPC). For example, these are founded as values converted to polystyrene using tetrahydrofuran and other solvents as eluents.

Further, the resin composition used in the present invention is preferably one further containing at least one of an alkoxysilyl group containing (meth)acrylate compound (B), tetrafunctional or higher functional (meth)acrylate compound (C), photopolymerization initiator (D), and crosslinking agent (E).

The alkoxysilyl group-containing (meth)acrylate compound (B) is a (meth)acrylic acid ester which has an alkoxysilyl group.

As specific examples of the alkoxysilyl group-containing (meth)acrylate compound (B), 2-acryloxyethyl trimethoxysilane, 2-acryloxyethyl triethoxysilane, 3-acryloxypropyl trimethoxysilane, 3-acryloxypropylmethyl dimethoxysilane, 3-acryloxypropyl triethoxysilane, 4-acryloxybutyl trimethoxysilane, 4-acryloxybutyl triethoxysilane, 2-methacryloxyethyl trimethoxysilane, 2-methacryloxyethyl triethoxysilane, 3-methacryloxypropyl trimethoxysilane, 3-methacryloxypropylmethyl dimethoxysilane, 3-methacryloxypropyl triethoxysilane, 3-methacryloxymethyl diethoxysilane, 4-methacryloxybutyl trimethoxysilane, 4-methacryloxybutyl triethoxysilane, etc. may be mentioned. These may be used as single type alone or as two types or more combined.

In the resin composition used in the present invention, the content of the alkoxysilyl group-containing (meth)acrylate compound (B) is preferably 0.5 to 4 parts by weight with respect to 100 parts by weight of the resin (A), more preferably 0.5 to 2.5 parts by weight, furthermore preferably 0.8 to 2 parts by weight.

The tetrafunctional or higher functional (meth)acrylate compound (C) is a (meth)acrylic acid ester which has four or more (meth)acryloyl groups.

As specific examples of the tetrafunctional or higher functional (meth)acrylate compound (C), dipentaerythritol hexaacrylate (for example, product name "DPHA", made by Daicel Cytec, or product name "Light Acrylate DPE-6A", made by Kyoei Kagaku Kogyo, or product name "A-DPH", made by Shin-Nakamura Chemical), pentaerythritol ethoxy tetracrylate (for example, product name "EBECRYL40", made by Daicel Cytec), ditrimethylolpropane tetracrylate (for example, product name "AD-MP", made by Shin-Nakamura Chemical), ethoxylated pentaerythritol tetracrylate (for example, product name "ATM-35E", made by Shin-Nakamura Chemical), pentaerythritol tetracrylate (for example, product name "A-TMMT", made by Shin-Nakamura Chemical), dipentaerythritol polyacrylate (for example, product name "A-9550", made by Shin-Nakamura Chemical), pentaerythritol tri/tetracrylate (for example, product name "Aronix M-303 Tri 40-60%", or product name "Aronix M-305 Tri 55-63%", or product name "Aronix M-306 Tri 65-70%", all made by Toagosei), dipentaerythritol penta/hexaacrylate (for example, product name "Aronix M-402 Penta 30-40%", or product name "Aronix M-406 Penta 25-35%", all made by Toagosei), ditrimethylolpropane tetracrylate (for example, product name "Aronix M-408", made by Toagosei), polybasic acid-modified acrylic oligomer (for example, product name "Aronix M-510", made by Toagosei), etc. may be mentioned. These may be used as single type alone or as two types or more combined.

In the resin composition used in the present invention, the content of tetrafunctional or higher functional (meth)acrylate compound (C) is preferably 0.5 to 7 parts by weight with respect to 100 parts by weight of the resin (A), more preferably 0.5 to 5 parts by weight, furthermore preferably 2 to 4 parts by weight.

The photopolymerization initiator (D) is not particularly limited so long as a compound which causes a chemical reaction by light, but a radical generating type photopolymerization initiator which generates radicals due to light and thereby causes a chemical reaction is preferable. In particular, among radical generating type photopolymerization initiators, a compound which has a sensitivity with respect to 400 nm or less wavelength light and generates radicals and which causes a chemical reaction when being irradiated by 400 nm or less wavelength light, specifically ultraviolet light or electron beams and other radiation, is preferable.

As specific examples of such a radical generating type photopolymerization initiator, benzophenone, methyl o-benzoyl benzoate, 4,4-bis(dimethylamine) benzophenone, 4,4-bis(diethylamine)benzophenone, α-amino-acetophenone, 4,4-dichlorobenzophenone, 4-benzoyl-4-methyldiphenylketone, dibenzylketone, fluorene, 2,2-diethoxyacetophenone, 2,2-dimethoxy-2-phenylacetophenone, 2-hydroxy-2-methylpropiophenone, p-tert-butyldichloroacetophenone, thioxantone, 2-methylthioxantone, 2-chlorothioxantone, 2-isopropylthioxantone, diethylthioxantone, benzyldimethylketal, benzylmethoxyethylacetal, benzoinmethyl ether, benzoinbutyl ether, anthraquinone, 2-tert-butylanthraquinone, 2-amylbutylanthraquinone, β-chloroanthraquinone, anthrone, benzanthrone, dibenzsuberon, methylene anthrone, 4-acidobenzylacetophenone, 2,6-bis(p-azidebenzylidene)cyclohexane, 2,6-bis(p-azidebenzylidene)-4-methylcyclohexanone, 2-phenyl-1,2-butadione-2-(o-methoxycarbonyl) oxime, 1-phenyl-propanedion-2-(o-ethoxycarbonyl) oxime, 1,3-diphenyl-propanetrione-2-(o-ethoxycarbonyl) oxime, 1-phenyl-3-ethoxy-propanetrione-2-(o-benzoyl) oxime, Michler's ketone, 2-methyl-1[4-(methylthio)phenyl]-2-morpholinopropan-1-one, 2-benzyl-2-dimethylamino-1-(4-morpholinophenyl)-butanone, naphthalenesulfonyl chloride, quinolinesulfonyl chloride, n-phenylthioacrylidone, 4,4-azobisisobutyronitrile, diphenyl disulfide, benzothiazole disulfide, triphenylphosphine, camphorquinone, N,N-octamethylenebisacridine, 2-(dimethylamino)-2-[(4-ethylphenyl)ethyl]-1-[4-(4-morpholinyl)phenyl]-1-butanone (product name "Irgacure 379EG", made by BASF), 1-hydroxy-cyclohexyl-phenyl-ketone (product name "IRGACURE 184", made by BASF), 2-hydroxy-1-{4-[4-(2-hydroxy-2-ethyl-propionyl)-benzyl]phenyl}-2-methyl propan-1-one (product name "IRGACURE 127", made by BASF), 2-methyl-1-(4-methylthiophenyl)-2-morpholinopropan-1-one (product name "IRGACURE 907", made by BASF), 1,7-bis(9-acridyl)-heptane (made by ADEKA, N1717), 1,2-octanedion, 1-[4-(phenylthio)-, 2-(o-benzoyloxime)] (made by BASF, OXE-01), ethanone, 1-[9-ethyl-6-(2-methylbenzoyl)-9H-carbazol-3-yl]-, 1-(o-acetyloxime) (made by BASF, OXE-02), carbon tetrachloride, tribromophenylsulfone, benzoin peroxide, eosin, methylene blue, and other photoreducing dyes and ascorbic acid or triethanolamine and other reducing agents in combination etc. may be mentioned. These may be used as single type alone or as two types or more combined.

In the resin composition used in the present invention, the content of the photopolymerization initiator (D) is preferably 0.3 to 8 parts by weight with respect to 100 parts by weight of the resin (A), more preferably 0.5 to 6 parts by weight, furthermore preferably 0.7 to 4 parts by weight.

As the cross-linking agent (E), one which forms a cross-linked structure between cross-linking agent molecules due to heating or one which reacts with the resin (A) to form a cross-linked structure between resin molecules may be mentioned, specifically, a compound which has two or more reactive groups may be mentioned. As such a reactive group, for example, an amino group, carboxy group, hydroxyl group, epoxy group, or isocyanate group may be mentioned. More preferably, it is an amino group, epoxy group, and isocyanate group. An amino group and epoxy group is particularly preferable.

As specific examples of the cross-linking agent (E), hexamethylenediamine and other aliphatic polyamines; 4,4'-diaminodiphenyl ether, diaminodiphenyl sulfone, and other aromatic polyamines; 2,6-bis(4'-azidebenzal)cyclohexanone, 4,4'-diazidediphenyl sulfone, and other azides; nylon, polyhexamethylenediamine terephthalamide, polyhexamethyleneisophthalamide, and other polyamides; N,N,N',N',N'',N''-(hexaalkoxyalkyl)melamine, and other melamines which may have a methylol group, imino group, etc. (product name "Cymel 303, Cymel 325, Cymel 370, Cymel 232, Cymel 235, Cymel 272, Cymel 212, Mycoat 506" (above, made by Cytec Industries) and other Cymel series and Mycoat series products); N,N',N'',N'''-(tetraalkoxyalkyl)glycoluril, and other glycolurils which may have a methylol group, imino group etc. (product name "Cymel 1170" (above, made by Cytec Industries) and other Cymel series products); ethylene glycol di(meth)acrylate and other acrylate compounds; hexamethylene diisocyanate-based polyisocyanate, isophorone diisocyanate-based polyisocyanate, tolylene diisocyanate-based polyisocyanate, hydrated diphenylmethane diisocyanate, and other isocyanate-based compounds; 1,4-di-(hydroxymethyl)cyclohexane, 1,4-di-(hydroxymethyl) norbornane; 1,3,4-trihydroxycyclohexane; bisphenol A-type epoxy resin, bisphenol F-type epoxy resin, phenol novolac-type epoxy resin, cresol novolac-type epoxy resin, polyphenol-type epoxy resin, cyclic aliphatic epoxy resin, aliphatic glycidyl ether, epoxy acrylate polymer, and other epoxy compounds; may be mentioned.

Further, as specific examples of the epoxy compound, a trifunctional epoxy compound which has a dicyclopentadiene structure (product name "XD-1000", made by Nippon Kayaku), a 1,2-epoxy-4-(2-oxiranyl)cyclohexane adduct of 2,2-bis(hydroxymethyl) 1-butanol (pentadecafunctional alicyclic epoxy resin having a cyclohexane structure and end epoxy groups, product name "EHPE3150", made by Daicel Chemical Industry), epoxylated 3-cyclohexene-1,2-dicarboxylic acid bis(3-cyclohexenylmethyl) modified ε-caprolactone (aliphatic cyclic trifunctional epoxy resin, product name "Epolide GT301", made by Daicel Chemical Industry), epoxylated butanetetracarboxylic acid tetrakis(3-cyclohexenylmethyl) modified ε-caprolactone (aliphatic cyclic tetrafunctional epoxy resin, product name "Epolide GT401", made by Daicel Chemical Industry), and other epoxy compounds having alicyclic structures;

aromatic amine-type polyfunctional epoxy compound (product name "H-434", made by Tohto Chemical Industry), cresol novolac-type polyfunctional epoxy compound (product name "EOCN-1020", made by Nippon Kayaku), phenol novolac-type polyfunctional epoxy compound (Epicoat 152, 154, made by Japan Epoxy Resin), polyfunctional epoxy compound having a naphthalene structure (product name EXA-4700, made by DIC), chain alkylpolyfunctional epoxy compound (product name "SR-TMP", made by Sakamoto Yakuhin Kogyo Co., Ltd.), polyfunctional epoxy polybutadiene (product name "Epolide PB3600", made by Daicel Chemical Industry), glycidyl polyether compound of glycerin (product name "SR-GLG", made by Sakamoto Yakuhin Kogyo Co., Ltd.), diglycerin polyglycidyl ether compound (product name "SR-DGE", made by Sakamoto Yakuhin Kogyo Co., Ltd.), polyglycerin polyglycidyl ether compound (product name "SR-4GL", made by Sakamoto Yakuhin Kogyo Co., Ltd.), and other epoxy compounds not having an alicyclic structure; may be mentioned.

In the resin composition used in the present invention, the content of the cross-linking agent (E) is not particularly limited, but is preferably 3 to 70 parts by weight with respect to 100 parts by weight of the resin (A), more preferably 4 to 45 parts by weight, furthermore preferably 5 to 25 parts by weight. Tether the cross-linking agent (E) is too great or too small, the heat resistance tends to fall.

Further, the resin composition used in the present invention may further contain a solvent. The solvent is not particularly limited, but one known as a solvent of a resin composition, for example, acetone, methylethylketone, cyclopentanone, 2-hexanone, 3-hexanone, 2-heptanone, 3-heptanone, 4-heptanone, 2-octanone, 3-octanone, 4-octanone, or other straight chain ketones; n-propyl alcohol, isopropyl alcohol, n-butyl alcohol, cyclohexanol, or other alcohols; ethyleneglycol dimethyl ether, ethyleneglycol diethyl ether, dioxane, or other ethers; ethyleneglycol monomethyl ether, ethyleneglycol monethyl ether, or other alcohol ethers; propyl formate, butyl formate, propyl acetate, butyl acetate, methyl propionate, ethyl propionate, methyl butyrate, ethyl butyrate, methyl lactate, ethyl lactate, or other esters; cellosolve acetate, methylcellosolve acetate, ethylcellosolve acetate, propylcellosolve acetate, butylcellosolve acetate, or other cellosolve esters; propyleneglycol, propyleneglycol monomethyl ether, propylene glycol monomethyl ether acetate, propylene glycol monoethyl ether acetate, propylene glycol monobutyl ether, or other propylene glycols; diethylene glycol monomethyl ether, diethylene glycol monoethyl ether, diethylene glycol dimethyl ether, diethylene glycol diethyl ether, diethylene glycol methylethyl ether, or other diethylene glycols; γ-butyrolactone, γ-valerolactone, γ-caprolactone, γ-caprylolactone, or other saturated γ-lactones; trichloroethylene or other halogenated hydrocarbons; toluene, xylene, or other aromatic hydrocarbons; dimethylacetoamide, dimethylformamide, N-methylacetoamide, or other polar solvents; etc. may be mentioned. These solvents may be used alone or as two types or more combined. The content of the solvent is preferably 10 to 10000 parts by weight with respect to 100 parts by weight of the resin (A), more preferably 50 to 5000 parts by weight, furthermore preferably 100 to 1000 parts by weight in range.

Further, the resin composition used in the present invention may be one which contains a radiation-sensitive compound. A radiation-sensitive compound is a compound which can cause a chemical reaction by irradiation by ultraviolet rays or an electron beam or other radiation. The radiation-sensitive compound is preferably one which can control the alkali solubility of the passivation film 7 which is comprised of the resin composition, particularly a photoacid generator is preferable.

As such a radiation-sensitive compound, for example, an acetophenone compound, triaryl sulfonium salt, quinone diazide compound, and other azide compounds etc. may be mentioned, but it is preferably an azide compound, particularly preferably a quinone diazide compound.

As the quinone diazide compound, for example, an ester compound of a quinone diazide sulfonic acid halide and a compound which has a phenolic hydroxyl group can be used. As specific examples of the quinone diazide sulfonic acid halide, 1,2-naphthoquinone diazide-5-sulfonic acid chloride, 1,2-naphthoquinone diazide-4-sulfonic acid chloride, 1,2-benzoquinone diazide-5-sulfonic acid chloride, etc. may be mentioned. As typical examples of a compound which has a phenolic hydroxyl group, 1,1,3-tris(2,5-dimethyl-4-hydroxyphenyl)-3-phenylpropane, 4,4'-[1-[4-[1-[4-hydroxyphenyl]-1-methylethyl]phenyl]ethylidene]bisphenol, etc. may be mentioned. As other compounds which have a phenolic hydroxyl group, 2,3,4-trihydroxybenzophenone, 2,3,4,4'-tetrahydroxybenzophenone, 2-bis(4-hydroxyphenyl)propane, tris(4-hydroxyphenyl)methane, 1,1,1-tris(4-hydroxy-3-methylphenyl)ethane, 1,1,2,2-tetrakis(4-hydroxyphenyl)ethane, oligomers of novolac resins, oligomers obtained by copolymerization of a compound which has one or more phenolic hydroxyl groups and dicyclopentadiene, etc. may be mentioned.

Among these as well, a condensate of 1,2-naphthoquinone diazide-5-sulfonic acid chloride and a compound which has a phenolic hydroxyl group is preferable, while a condensate of 1,1,3-tris(2,5-dimethyl-4-hydroxyphenyl)-3-phenylpropane (1 mole) and 1,2-naphthoquinone diazide-5-sulfonic acid chloride (1.9 mole) is more preferable.

Further, as the photoacid generator, in addition to the quinone diazide compound, an osmium salt, halogenated organic compound, α,α'-bis(sulfonyl)diazomethane-based compound, α-carbonyl-α'-sulfonyldiazomethane-based compound, sulfone compound, organic acid ester compound, organic acid amide compound, organic acid imide compound, or other known one can be used. These radiation-sensitive compounds may be used as single type alone or as two types or more combined.

Further, the resin composition used in the present invention may contain, as desired a surfactant, acidic compound, coupling agent or its derivative, sensitizer, latent acid generator, antioxidant, photostabilizer, defoamer, pigment, dye, filler, and other compounding agents etc.

The surfactant is used to prevent striation, improve the development property, and for other purposes. As specific examples of the surfactant, polyoxyethylene lauryl ether, polyoxyethylene stearyl ether, polyoxyethylene oleyl ether, and other polyoxyethylene alkyl ethers; polyoxyethylene octylphenyl ether, polyoxyethylene nonyl phenyl ether, and other polyoxyethylene aryl ethers; polyoxyethylene dilaurate, polyoxyethylene distearate, and other polyoxyethylene dialkyl esters, and other nonion-based surfactants; fluorine-based surfactants; silicone-based surfactants; methacrylic acid copolymer-based surfactants; acrylic acid copolymer-based surfactants; etc. may be mentioned.

The coupling agent or its derivative has the effect of further raising the adhesion of a resin film comprised of the resin composition and the layers, including the semiconductor layer, which forms the semiconductor device substrate. As the coupling agent or its derivative, a compound which has one atom selected from a silicon atom, titanium atom, aluminum atom, and zirconium atom and has a hydrocarbyloxy group or hydroxyl group which bonds with that atom can be used.

As the coupling agent or its derivative, for example, tetramethoxysilane, tetraethoxysilane, tetra-n-propoxysilane, tetra-i-propoxysilane, tetra-n-butoxysilane, and other tetraalkoxysilanes, methyltrimethoxysilane, methyltriethoxysilane, ethyltrimethoxysilane, ethyltriethoxysilane, n-propyltrimethoxysilane, n-propyltriethoxysilane, i-propyltrimethoxysilane, i-propyltriethoxysilane, n-butyltrimethoxysilane, n-butyltriethoxysilane, n-pentyltrimethoxysilane, n-hexyltrimethoxysilane, n-heptyltrimethoxysilane, n-octyltrimethoxysilane, n-decyltrimethoxysilane, p-styryltrimethoxysilane, vinyltrimethoxysilane, vinyltriethoxysilane, cyclohexyltrimethoxysilane, cyclohexyltrimethoxysilane, cyclohexyltriethoxysilane, phenyltrimethoxysilane, phenyltriethoxysilane, 3-chloropropyltrimethoxysilane, 3-chloropropyltriethoxysilane, 3,3,3-trifluoropropyltrimethoxysilane, 3,3,3-trifluoropropyltriethoxysilane, 3-aminopropyltrimethoxysilane, 3-aminopropyltriethoxysilane, N-2-(aminoethyl)-3-aminopropyltrimethoxysilane, N-phenyl-3-aminopropyltrimethoxysilane, 2-hydroxyethyltrimethoxysilane, 2-hydroxyethyltriethoxysilane, 2-hydroxypropyltrimethoxysilane, 2-hydroxypropyltriethoxysilane, 3-hydroxypropyltrimethoxysilane, 3-hydroxypropyltriethoxysilane, 3-mercaptopropyltrimethoxysilane, 3-mercaptopropyltriethoxysilane, 3-isocyanate propyltrimethoxysilane, 3-isocyanate propyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, 3-(meth)acryloxypropyltrimethoxysilane, 3-(meth)acryloxypropyltriethoxysilane, 3-ureidopropyltrimethoxysilane, 3-ureidopropyltriethoxysilane, 3-ethyl(trimethoxysilylpropoxymethyl)oxetane, 3-ethyl(triethoxysilylpropoxymethyl)oxetane, 3-triethoxysilyl-N-(1,3-dimethyl-butylidene)propylamine, bis(triethoxysilylpropyl) tetrasulfide, and other trialkoxysilanes, dimethyldimethoxysilane, dimethyldiethoxysilane, diethyldimethoxysilane, diethyldiethoxysilane, di-n-propyldimethoxysilane, di-n-propyldiethoxysilane, di-i-propyldimethoxysilane, di-i-propyldiethoxysilane, di-n-butyldimethoxysilane, di-n-pentyldimethoxysilane, di-n- pentyldiethoxysilane, di-n-hexyldimethoxysilane, di-n-hexyldiethoxysilane, di-n-heptyldimethoxysilane, di-n-heptyldiethoxysilane, di-n-octyldimethoxysilane, di-n-octyldiethoxysilane, di-n-cyclohexyldimethoxysilane, di-n-cyclohexyldiethoxysilane, diphenyldimethoxysilane, diphenyldiethoxysilane, 3-glycidoxypropylmethyldiethoxysilane, 3-methacryloxypropylmethyldimethoxysilane, 3-acryloxypropylmethyldimethoxysilane, 3-methacryloxypropylmethyldiethoxysilane, 3-acryloxypropylmethyldiethoxysilane, N-2-(aminoethyl)-3-aminopropylmethyldimethoxysilane, and other dialkoxysilanes, and methyl triacetyloxysilane, dimethyl diacetyloxysilane, and other silicon atom-containing compounds;

titanium tetra-i-propoxide, titanium tetra-n-butoxide, titanium tetrakis(2-ethylhexyloxide), titanium i-propoxyoctyleneglycolate, titanium di-i-propoxy-bis(acetylacetonate), propane dioxytitanium bis(ethylacetoacetate), tri-n-butoxytitanium monostearate, di-i-propoxytitanium distearate, titanium stearate, di-i-propoxytitanium diisostearate, titanium (2-n-butoxycarbonylbenzoyloxy)tributoxide, di-n-butoxy-bis(triethanolaminate)titanium, and the Plenacto series (made by Ajinomoto Fine Techno) and other titanium-atom containing compounds;

acetoalkoxyaluminum diisopropylate, and other aluminum-atom containing compounds;

zirconium tetra-n-propoxide, zirconium tetra-n-butoxide, zirconium tetraacetyl acetonate, zirconium tributoxyacetyl acetonate, zirconium monobutoxyacetyl acetonate bis(ethylacetoacetate), zirconium dibutoxybis(ethylacetoacetate), zirconium tetraacetyl acetonate, zirconium tributoxy stearate and other zirconium-atom containing compounds may be mentioned.

As specific examples of the sensitizer, 2H-pyrido-(3,2-b)-1,4-oxazin-3 (4H)-ones, 10H-pyrido (3,2-b)-1,4-benzothiadines, urazoles, hydantoins, barbituric acids, glycine anhydrides, 1-hydroxybenzotriazoles, alloxans, maleimides, etc. may be mentioned.

As antioxidants, a phenol-based antioxidant, phosphorus-based antioxidant, sulfur-based antioxidant, lactone-based antioxidant, etc. used for a usual polymer can be used. For example, as phenols, 2,6-di-t-butyl-4-methylphenol, p-methoxyphenol, styrenated phenol, n-octadecyl-3-(3',5'-di-t-butyl-4'-hydroxyphenyl) propionate, 2,2'-methylene-bis (4-methyl-6-t-butylphenol), 2-t-butyl-6-(3'-t-butyl-5'-methyl-2'-hydroxybenzyl)-4-methylphenylacrylate, 4,4'-butylidene-bis-(3-methyl-6-t-butylphenol), 4,4'-thio-bis(3-methyl-6-t-butylphenol), pentaerythritol tetrakis[3-(3,5-di-t-butyl-4-hydroxyphenyl) propionate], alkylated bisphenol, etc. may be mentioned. As the phosphorus-based antioxidants, triphenyl phosphite and tris(nonylphenyl) phosphite may be mentioned, while as the sulfur-based ones, dilauryl thiodipropionate etc. may be mentioned.

As light stabilizers, benzophenone-based, salicyclic acid ester-based, benzotriazole-based, cyanoacrylate-based, metal complex-based, and other ultraviolet ray absorbers, hindered amine-based light stabilizers (HALS) and other stabilizers which trap radicals generated due to light may be used. Among these as well, a HALS is a compound which has a piperidine structure and is preferable since it causes little coloring with respect to a radiation-sensitive resin composition and is good in stability. As specific compounds, bis(2,2,6,6-tetramethyl-4-piperidyl) sebacate, 1,2,2,6,6-pentamethyl-4-piperidyl/tridecyl-1,2,3,4-butanetetracarboxylate, bis(1-octyloxy-2,2,6,6-tetramethyl-4-piperidyl)sebacate, etc. may be mentioned.

The resin composition used in the present invention can be prepared by mixing resin composition used in the present invention using a known method. The method of mixing is not particularly limited, but it is preferable to dissolve or disperse the components which form the resin composition in solvents and mix the solutions or dispersions. Due to this, the resin composition is obtained in the form of a solution or dispersion.

In the method of production of the present invention, the above such resin composition is used to form a passivation film 7.

In the method of production of the present invention, the patterning may also be performed after forming the passivation film 7 so as to cover the entire top surfaces (exposed surfaces) of the board 2, semiconductor layer 4, source electrode 5, and drain electrode 6 and before baking. This passivation film 7 may be patterned by, for example, the method of dry etching using the photoresist as a mask, the method of introducing the above mentioned radiation sensitive compound into the resin composition, using active radiation to form a latent pattern on the resin film formed using that resin composition, and using a developing solution to develop the latent pattern, etc.

The active radiation is not particularly limited so long as able to radiation-sensitive compound and change the alkali solubility of the passivation film 7. Specifically, ultraviolet light, g-rays or i-rays and other single wavelength ultraviolet light, KrF excimer laser light, ArF excimer laser light, and other light beams; electron beams and other particle beams; etc. may be used. As the method of selectively radiating active radiation in a pattern manner to form latent patterns, an ordinary method may be used. For example, the method of using a reduced projection exposure apparatus etc. to irradiate ultraviolet light, g-rays, i-rays, KrF excimer laser light, ArF excimer laser light, and other light beams through a desired mask pattern or the method of using an electron bean or other particle beam for lithography etc. may be used. When using light beams as active radiation, single wavelength light or mixed wavelength light may be used. The irradiation conditions may be suitably selected in accordance with the active radiation used, but, for example, when using wavelength 200 to 450 nm light beams, the amount of irradiation is normally 10 to 1,000 mJ/cm$^2$, preferably 50 to 500 mJ/cm$^2$ in range and is determined in accordance with the irradiation time and illuminance. After irradiating the active radiation in this way, in accordance with need, the passivation film 7 is heat treated at 60 to 130° C. or so in temperature for 1 to 2 minutes or so.

Next, the latent patterns which are formed in the passivation film 7 are developed to manifest them and form the patterns. As the developing solution, normally aqueous solutions of alkali compounds may be used. As alkali compounds, for example, alkali metal salts, amines, and ammonium salts may be used. The alkaline compounds may be inorganic compounds or organic compounds. As specific examples of these compounds, sodium hydroxide, potassium hydroxide, sodium carbonate, sodium silicate, metasodium silicate, and other alkali metal salts; ammonia water; ethylamine, n-propylamine, and other primary amines; diethylamine, di-n-propylamine, and other secondary amines; triethylamine, methyldiethylamine, and other tertiary amines; tetramethylammonium hydroxide, tetraethylammonium hydroxide, tetrabutylammonium hydroxide, choline, and other quaternary ammonium salts; dimethylethanolamine, triethanolamine, and other alcohol amines; pyrrol, piperidine, 1,8-diazabicyclo[5.4.0]undec-7-ene, 1,5-diazabicyclo[4.3.0]non-5-ene, N-methylpyrrolidone, and other cyclic amines; etc. may be mentioned. These alkali compounds may be respectively used alone or as two types or more combined.

As the aqueous medium of the alkali aqueous solution, water; methanol, ethanol, and other water soluble organic solvents can be used. The alkali aqueous solution may have a surfactant etc. added in a suitable amount.

As the method for bringing the developing solution in contact with the passivation film 7 which has the latent patterns, for example, the puddle method, spray method, dipping method, and other methods may be used. The development is normally 0 to 100° C., preferably 5 to 55° C., more preferably 10 to 30° C. in range and normally 30 to 180 seconds in range.

After forming the passivation film 7 having the desired patterns in this way, it can be rinsed by a rinse solution in accordance with need so as to remove the development residue. After the rinse treatment, the remaining rinse solution is removed by compressed air or compressed nitrogen. Further, in accordance with need, to deactivate a radiation-sensitive compound, it is also possible to fire active radiation against the entire surface of the device on which the passivation film 7 is formed. To fire the active radiation, it is possible to utilize a method illustrated for forming a latent pattern. Further, it is possible to form a passivation film 7 having a desired pattern in this way, then bake it as explained above, then cool it by a predetermined cooling speed to thereby obtain a semiconductor device 1 having a patterned passivation film 7.

Note that, in the above, the semiconductor device 1 shown in FIG. 1 is explained as an example, but the semiconductor device according to the method of production of the present invention is not particularly limited to the form shown in FIG. 1. It may be any semiconductor device having a semiconductor layer containing an inorganic oxide semiconductor on a board and having a passivation film comprised of an organic material formed so as to cover the semiconductor layer.

Further, the semiconductor device obtained by the method of production of the present invention is one which has a threshold voltage Vth close to zero and a high mobility, so it is possible to make use of those characteristics and use it as a semiconductor device assembled in various types of semiconductor modules. Particularly, the semiconductor device obtained by the method of production of the present invention can be suitably used as a thin film transistor used for an active matrix type liquid crystal display, active matrix type organic EL, or other display device etc.

EXAMPLES

Below, examples and comparative examples will be given to more specifically explain the present invention. In the examples, "parts" and "%" are based on weight unless otherwise particularly indicated.

Note that, the definitions and methods of evaluation of the different properties were as follows.

<Threshold Voltage Vth>

Figure 4:
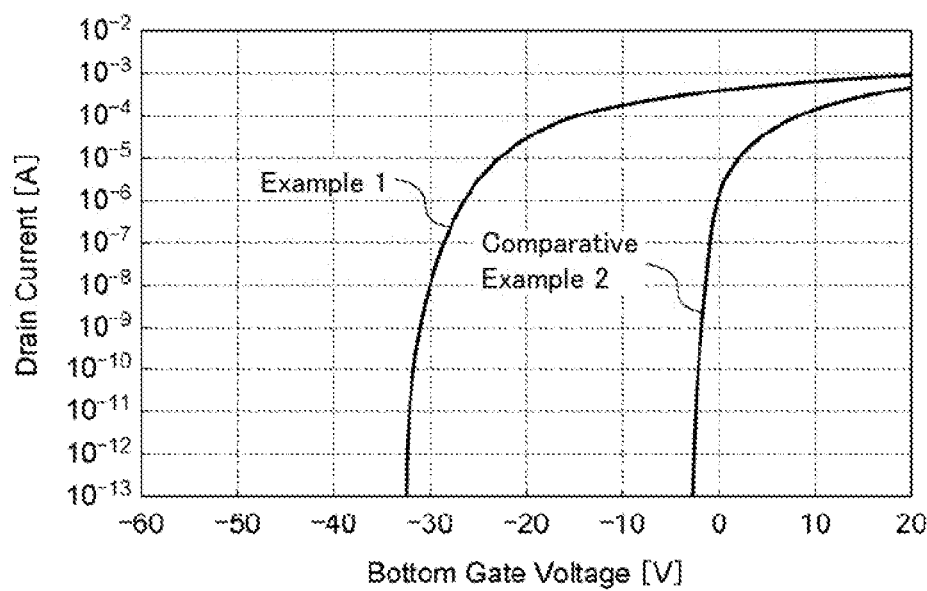
FIG. 4 is a graph showing changes in the current flowing between a source and drain with respect to the changes in the gate voltage of thin film transistors obtained in Example 1 and Comparative Example 2.

The obtained thin film transistor was measured for the change in current flowing between the source and drain with respect to a change in gate voltage by changing the gate voltage from 60V to +20V in the atmosphere in a dark room using a semiconductor parameter analyzer (made by Agilent, 4156C). Further, the voltage where, as a result of measurement, the value of the current flowing between the source and drain becomes Id=100 nA×(W/L) (where W is the channel width, L is the channel length, and Id is the drain current) was made the threshold voltage Vth. FIG. 4 shows the change in the current flowing between the source and drain with respect to a change of the gate voltage in the thin film transistor obtained in Example 1 and Comparative Example 2.

<Mobility>

The obtained thin film transistor was measured for the change in current flowing between the source and drain with respect to a change in gate voltage by changing the gate voltage from 60V to +20V in the atmosphere in a dark room using a semiconductor parameter analyzer (made by Agilent, 4156C). The field effect mobility from the saturated region of the thin film transistor was found in accordance with the following formula:

$$Id = \mu Cin \cdot W \cdot (Vg - Vth)^2 / 2L$$

(where, Cin: electrostatic capacitance per unit area of gate insulating film, W: channel width, L: channel length, Vg: gate voltage, Id: drain current, μ: mobility, and Vth: threshold voltage of gate)

Synthesis Example 1

<Preparation of Cyclic Olefin Polymer (A-1)>

100 parts of a monomer mixture comprised of 40 mol % of N-phenyl-bicyclo[2.2.1]hept-5-ene-2,3-dicarboxyimide (NBPI), and 60 mol % of 4-hydroxycarbonyltetracyclo[6.2.1.1$^{3,6}$.0$^{2,7}$]dodec-9-ene (TCDC), 2.0 parts of 1,5-hexadiene, 0.02 part of (1,3-dimesitylimidazolin-2-ylidene) (tricyclohexylphosphine)benzylidene ruthenium dichloride (synthesized by method described in "Org. Lett., vol. 1, p. 953, 1999"), and 200 parts of diethyleneglycol ethylmethylether were charged in a nitrogen substituted glass pressure resistant reactor and stirred while reacting them at 80° C. for 4 hours to obtain a polymerization reaction solution.

Further, the obtained polymerization reaction solution was placed in an autoclave and stirred at 150° C. by a hydrogen pressure 4 MPa for 5 hours to perform a hydrogenation reaction and obtain a polymer solution containing a cyclic olefin polymer (A-1). The obtained cyclic olefin polymer (A-1) had a polymerization conversion rate of 99.7%, a polystyrene conversion weight average molecular weight of 7,150, a number average molecular weight of 4,690, a molecular weight distribution of 1.52, and a hydrogenation rate of 99.7%. The obtained polymer solution of the cyclic olefin polymer (A-1) had a solid content concentration of 34.4 wt %.

Example 1

<Preparation of Resin Composition>

291 parts of the polymer solution of the cyclic olefin polymer (A-1) obtained in Synthesis Example 1 (as cyclic olefin polymer (A-1), 100 parts) as a binder resin (A), 1 part of 3-acryloxypropyl trimethoxysilane (product name "KBM-5103", made by Shin-Etsu Chemical) as an alkoxysilyl group-containing (meth)acrylate compound (B), 3 parts of dipentaerythritol penta/hexaacrylate (product name "Aronix M-406 Penta 25-35%", made by Toagosei) as a tetrafunctional or higher functional (meth)acrylate compound (C), 1 part of 2-hydroxy-1-(4-[4-(2-hydroxy-2-methyl-propionyl)benzyl]phenyl)-2-methylpropan-1-one (product name "Irgacure 127", made by BASF) as a photopolymerization initiator (D), 15 parts of epoxylated butanetetracarboxylic acid tetrakis(3-cyclohexenylmethyl) modified ε-caprolactone (aliphatic cyclic tetrafunctional epoxy resin, product name "Epolide GT401", made by Daicel Chemical Industry) as a cross-linking agent (E), 0.03 part of a silicone-based surfactant (product name "KP-341", made by Shin-Etsu Chemical), and 270 parts of ethyleneglycolethylmethyl ether as a solvent were mixed and made to dissolve, then the mixture was filtered by a pore size 0.45 μm polytetrafluoroethylene filter to prepare a resin composition.

<Preparation of Thin Film Transistor>

Next, the following method was used to prepare a thin film transistor having the constitution shown in FIG. 1. That is, first, a board 2 comprised of a p-type silicon board was prepared. The p-type silicon board was heat treated in an atmosphere of oxygen and hydrogen at 1000° C. for 13 minutes to form a 100 nm heat oxide film forming the gate insulating film on the p-type silicon board. Next, on this, a 50 nm In—Ga—Zn—O based non-single crystalline film was formed by sputtering with a flow ratio of $Ar/O_2$ at the time of film formation of 50%. Next, for patterning the In—Ga—Zn—O based non-single crystalline film, a positive type photoresist as an etching mask was coated by the spin coat method on the semiconductor layer and a hot plate was used to remove the solvent to thereby form a resist film. After this, the resist film was patterned via an exposure step and development step. Next, the formed mask was used for wet etching by phosphoric acid to pattern the In—Ga—Zn—O based non-single crystalline film in island shapes. Next, a peeling solution was used to remove the resist film and thereby form a semiconductor layer 4 (see FIG. 2A). Next, this was heat treated in a water vapor atmosphere ($H_2O/O_2$:10% $H_2O$) at 220° C. for 1 hour in conditions.

Next, to form the source electrode 5 and drain electrode 6, a positive type photoresist was coated by the spin coat method. A hot plate was used to remove the solvent to thereby form a resist film. After this, the resist film was patterned via an exposure step and development step to form a lift off resist 10 (see FIG. 2B). Next, the p-type silicon board (board 2) formed with the semiconductor layer 4 and lift off resist 10 was formed with Ti by the sputtering method to form a Ti film as a layer 20 comprised of an electroconductive material for forming the source electrode 5 and drain electrode 6 (see FIG. 2C). Next, the back surface of the board 2 (surface opposite to surface forming the semiconductor layer 4) is exposed to HF vapor, the $SiO_2$ film on the back surface of the board 2 is removed, then the back surface of the board 2 is formed with Al by the sputtering method to form an Al film as a gate electrode 3 (see FIG. 3A).

Next, the board 2 formed with the gate electrode 3, semiconductor layer 4, lift off resist 10, and layer 20 comprised of an electroconductive material was placed in acetone and treated by ultrasonic waves to thereby remove the lift off resist 10 and form the source electrode 5 and drain electrode 6 (see FIG. 3B). Next, this was coated with the above obtained resin composition by the spin coat method and was dried by heating (prebaked) using a hot plate under conditions of 115° C. for 2 minutes to form a thickness 1.5 μm resin film to thereby obtain a board on which a gate electrode 3, semiconductor layer 4, source electrode 5, drain electrode 6, and resin film are formed (below, referred to as the "resin film formed board"). Further, the obtained resin film formed board was placed in an oven and baked in the oven in an $N_2$ atmosphere at 230° C. for 60 minutes in conditions to bake the resin film. Further, after baking, in a state with the resin film formed board remaining placed in the oven, the board started to be cooled in an $N_2$ atmosphere by a 1° C./min cooling speed. When cooled down to 150° C., the resin film formed board was taken out in an air atmosphere at roan temperature to thereby obtain a thin film transistor comprised of a board 2, gate electrode 3, semiconductor layer 4, source electrode 5, drain electrode 6, and passivation film 7 shown in FIG. 1. Further, the obtained thin film transistor was used in accordance with the above mentioned method to measure the threshold voltage Vth and mobility. The results are shown in Table 1.

Example 2

Except for performing the cooling after the baking of the resin film in an $N_2$ atmosphere by a 0.5° C./min cooling speed down to 150° C., the same procedure was followed as in Example 1 to obtain a thin film transistor and the same procedure was followed to evaluate it. The results are shown in Table 1.

Example 3

Except for performing the cooling after the baking of the resin film in an $N_2$ atmosphere by a 5° C./min cooling speed down to 150° C., the same procedure was followed as in Example 1 to obtain a thin film transistor and the same procedure was followed to evaluate it. The results are shown in Table 1.

Comparative Example 1

Except for baking the resin film, then immediately taking out the baked resin film formed board in an air atmosphere at room temperature, the same procedure was followed as in Example 1 to obtain a thin film transistor and the same procedure was followed to evaluate it. The results are shown in Table 1.

Comparative Example 2

Except for not forming the passivation film 7, the same procedure was followed as in Example 1 to obtain a thin film transistor and the same procedure was followed to evaluate it. That is, in Comparative Example 2, without forming a resin film using a resin composition, baking and cooling were performed by the same conditions as in Example 1 to obtain a thin film transistor. That is, in Comparative Example 2, not the conditions for formation of a passivation film, but the conditions for heating without a passivation film are shown. The results are shown in Table 1.

TABLE 1

| | | Examples | | | Comparative Example | |
|---|---|---|---|---|---|---|
| | | 1 | 2 | 3 | 1 | 2 |
| Presence of passivation film | | Yes | Yes | Yes | Yes | No |
| Conditions of formation of passivation film | Baking temperature | 230° C. | 230° C. | 230° C. | 230° C. | 230° C. |
| | Baking atmosphere | $N_2$ | $N_2$ | $N_2$ | $N_2$ | $N_2$ |
| | Cooling atmosphere | $N_2$ | $N_2$ | $N_2$ | — | $N_2$ |

TABLE 1-continued

Table 1

| | | Examples | | | Comparative Example | |
| --- | --- | --- | --- | --- | --- | --- |
| | | 1 | 2 | 3 | 1 | 2 |
| Evaluation | Cooling speed | 1° C./min | 0.5° C./min | 5° C./min | — | 1° C./min |
| | Cooling end temperature | 150° C. | 150° C. | 150° C. | 230° C. | 150° C. |
| | Vth (V) | −1.3 | −0.7 | 6.3 | −29.6 | −30.1 |
| | Mobility (cm$^3$/V · s) | 13.2 | 13.5 | 12.0 | 8.5 | 8.4 |

Note that, in Table 1, "Cooling end temperature" is the temperature at the point of time when cooling by a predetermined cooling speed after baking, then taking out the sample in the air atmosphere at roan temperature. For this reason, in Comparative Example 1, since the sample is not cooled by a predetermined cooling speed after baking and is taken out in the air atmosphere at room temperature, so the baking temperature and the cooling end temperature are the same.

As shown in Table 1, when making the cooling speed when cooling a resin film after baking it 0.5 to 5° C./min in range, the obtained thin film transistors all had a threshold voltage Vth close to zero and further had a high mobility (Examples 1 to 3).

On the other hand, when not cooling by a 0.5 to 5° C./min cooling speed after baking the resin film and when not forming a passivation film, the obtained thin film transistors all had a large absolute value of the threshold voltage Vth and further a low mobility (Comparative Examples 1 and 2).

REFERENCE SIGN LIST

1 . . . semiconductor device
2 . . . board
3 . . . gate electrode
4 . . . semiconductor layer
5 . . . source electrode
6 . . . drain electrode
7 . . . passivation film

The invention claimed is:

1. A method of production of a semiconductor device comprising a semiconductor layer forming step of forming a semiconductor layer including an inorganic oxide semiconductor on a board,
a step of forming a source electrode and a drain electrode on the board that is formed with the semiconductor layer,
a passivation film forming step of forming a passivation film consisting of an organic material so as to cover entire exposed surfaces of the semiconductor layer, source electrode and the drain electrode after forming the source electrode and the drain electrode,
a baking step of baking the passivation film, wherein the baking temperature in the baking step is 200 to 300° C., and
a cooling step of cooling the passivation film after baking, wherein, in the cooling step, a cooling speed from a baking temperature at the time of baking in the baking step to a temperature 50° C. lower than the baking temperature is substantially controlled to 0.5 to 3° C./min in range.

2. The method of production of a semiconductor device according to claim 1 wherein, in the cooling step, a cooling speed from the baking temperature at the baking step to 150° C. is substantially controlled to 0.5 to 3° C./min in range.

3. The method of production of a semiconductor device according to claim 1 wherein the baking in the baking step and the cooling in the cooling step is performed in a non-oxidizing atmosphere.

4. The method of production of a semiconductor device according to claim 1 wherein the passivation film is formed using a resin composition containing at least one type of resin selected from a group consisting of a cyclic olefin resin, acrylic resin, cardo resin, polysiloxane resin, and polyimide resin.

5. The method of production of a semiconductor device according to claim 4 wherein the passivation film is formed using a resin composition containing a cyclic olefin resin having a protonic polar group.

6. The method of production of a semiconductor device according to claim 5 wherein the resin composition further contains an alkoxysilyl group containing (meth)acrylate compound, tetrafunctional or higher functional (meth)acrylate compound, photopolymerization initiator, and cross-linking agent.

7. A semiconductor device obtained by the method according to claim 1.

8. The method of production of a semiconductor device according to claim 1, the method further comprising a pre-baking step prior to the baking step.

* * * * *